(12) United States Patent
Murata et al.

(10) Patent No.: US 8,712,064 B2
(45) Date of Patent: Apr. 29, 2014

(54) SIGNAL PROCESSING DEVICE, SIGNAL PROCESSING METHOD AND PROGRAM

(75) Inventors: Yasunobu Murata, Tokyo (JP); Kohei Asada, Kanagawa (JP)

(73) Assignee: Sony Corporation, Tokyo (JP)

(*) Notice: Subject to any disclaimer, the term of this patent is extended or adjusted under 35 U.S.C. 154(b) by 680 days.

(21) Appl. No.: 12/694,563

(22) Filed: Jan. 27, 2010

(65) Prior Publication Data

US 2010/0202621 A1 Aug. 12, 2010

(30) Foreign Application Priority Data

Feb. 6, 2009 (JP) ................................. 2009-026552

(51) Int. Cl.
*H04R 5/00* (2006.01)
(52) U.S. Cl.
USPC ............................................................ 381/26
(58) Field of Classification Search
USPC ........... 381/26, 1, 2, 309, 17–19, 56–58, 314,
381/74, 71.1–71.4, 94.1–94.5, 102–104,
381/106–111; 379/430; 700/94; 455/557,
455/556.1; 704/500
See application file for complete search history.

(56) References Cited

U.S. PATENT DOCUMENTS

| | | | | |
|---|---|---|---|---|
| 4,817,149 A | * | 3/1989 | Myers | ................................. 381/1 |
| 7,187,948 B2 | * | 3/2007 | Alden | ............................ 455/557 |
| 2002/0141599 A1 | * | 10/2002 | Trajkovic et al. | ............. 381/71.6 |
| 2006/0009984 A1 | * | 1/2006 | Lim | ................................ 704/500 |
| 2006/0083388 A1 | * | 4/2006 | Rothschild | ........................ 381/81 |

FOREIGN PATENT DOCUMENTS

| | | | | | |
|---|---|---|---|---|---|
| GB | 2449083 | A | 11/2008 | | |
| JP | 08-023594 | A | 1/1996 | | |
| JP | 2000-209699 | A | 7/2000 | | |
| JP | 2004-191871 | A | 7/2004 | | |
| JP | 2004-526375 | A | 8/2004 | | |
| JP | 2006-092482 | A | 4/2006 | | |
| JP | 2007-036608 | A | 2/2007 | | |
| JP | 2007-036608 | | * 8/2007 | ................ | H04S 1/00 |
| JP | 2007-243493 | A | 9/2007 | | |
| JP | 2007-281916 | A | 10/2007 | | |
| JP | 2008-300894 | A | 12/2008 | | |
| WO | WO 96/33591 | A1 | 10/1996 | | |
| WO | WO 2007/102047 | | * 9/2007 | ............. | H04M 1/60 |
| WO | WO 2007/102047 | A1 | 9/2007 | | |

* cited by examiner

*Primary Examiner* — Lun-See Lao
(74) *Attorney, Agent, or Firm* — Wolf, Greenfield & Sacks, P.C.

(57) ABSTRACT

There is provided a signal processing device including: an audio signal acquisition portion that acquires audio signals; an external signal acquisition portion that acquires external signals; an output signal generation portion that generates output signals from the audio signals and the external signals; a mode setting portion that sets an external mode as an operation mode; and a fade control portion that controls the output signal generation portion in accordance with the operation mode. When the external mode is set, the fade control portion causes the output signal generation portion to generate the output signal for one of the right ear and the left ear of the user from at least the external signal, and also to generate the output signal for the other ear from at least the audio signal.

16 Claims, 13 Drawing Sheets

SIGNAL PROCESSING DEVICE, SIGNAL PROCESSING METHOD AND PROGRAM

BACKGROUND OF THE INVENTION

1. Field of the Invention

The present invention relates to a signal processing device, a signal processing method and a program.

2. Description of the Related Art

In recent years, a variety of mobile music players, including mobile telephones, have become widespread, and many people use headphones or earphones both inside and outside, such as in trains or in public spaces. The volume of audio emitted by the headphones can be set to a volume that suits each listener, respectively. However, listening to music is the objective in many cases, and the volume is often subjectively set relatively high with respect to peripheral noise.

For example, in a case in which a user goes shopping while listening to music, it is difficult to hear a voice of a store assistant etc. while listening to the music. There are many other cases in which it is necessary to listen to peripheral sound while using a music player or the like.

In this type of case, in order to listen to peripheral sound, such as a voice of a store assistant and so on, it is often necessary for the user to temporarily lower the volume of the music etc., stop playback of the music, remove the headphones from his or her head, or remove the headphones from one ear only.

SUMMARY OF THE INVENTION

One situation in which it is often necessary to remove headphones etc. is when conducting a conversation on a mobile telephone. For this type of case, an earphone microphone is disclosed, for example, in Japanese Patent Application Publication No. JP-A-2007-281916. While normally used for listening to music and so on, one of the speakers is a microphone, and the other speaker is used to listen to a voice of a conversation counterpart such that the earphone microphone also functions as a mobile telephone receiver.

According to the earphone microphone disclosed in Japanese Patent Application Publication No. JP-A-2007-281916, a mobile telephone conversation can be reliably conducted without removing the earphone microphone, but when it is desired to listen to peripheral sound in other situations, it is difficult to hear that peripheral sound.

In the case of a conversation using a mobile telephone, in many cases, the user tends to concentrate on that conversation. Therefore, many users are willing to remove the headphones etc.

On the other hand, a conversation during shopping or the like is often quickly completed, and its degree of importance may often be low to the user, with many cases in which content of the conversation can be ascertained with only a certain level of awareness maintained by the user. In this type of case, there are of course users who think "I don't want to interrupt what I am listening to," "It takes time to lower the volume," "If I remove one earphone, I won't be able to hear the vocals, so I don't want to remove it," "My player is in my bag so it is difficult to operate it, but I don't want to remove my headphones because I won't be able to listen any more" and so on. As a result, many users experience an impairment of their mood due to having to interrupt their listening because of peripheral sound, or feel uncomfortable at having to remove their headphones and so on.

In addition, with the earphone microphone disclosed in Japanese Patent Application Publication No. JP-A-2007-281916, as both microphones are used for conversation in any case, interruption of listening to music etc. is unavoidable. Meanwhile, for example, not only for conversation on a mobile telephone, but in other situations also, it is necessary to lower a sound volume (also referred to as a volume or sound level), to stop playback or to remove the headphones, thus making interruption of listening to the music etc. unavoidable. Moreover, in a case in which the headphones are removed from one ear only, if the music is stereo, for example, as there is a great difference between left and right audio signals, it is no longer possible to listen to the audio from the removed headphone and, although listening to the music etc. is not interrupted, it is reduced.

When using players and headphones that have a noise canceling function, which is recently becoming rapidly popular, it is even more difficult to hear this type of peripheral sound.

In light of the foregoing, it is desirable to provide a novel and improved signal processing device, signal processing method and program that are capable of reducing discomfort and inconvenience caused by interruption of listening to audio such as music etc., while also supplying peripheral sound.

According to an embodiment of the present invention, there is provided a signal processing device which includes an audio signal acquisition portion that acquires an audio signal representing stereo audio content, an external signal acquisition portion that acquires an external signal representing external sound obtained by collecting ambient sound, an output signal generation portion that generates, from the audio signal acquired by the audio signal acquisition portion and the external signal acquired by the external signal acquisition portion, an output signal representing stereo audio provided to a user, a mode setting portion that sets, as an operation mode of the output signal generation portion, at least an external mode corresponding to the generated output signal, and a fade control portion that controls an operation to generate the output signal by the output signal generation portion, in accordance with the operation mode set by the mode setting portion. When the external mode is set, the fade control portion causes the output signal generation portion to generate the output signal for one of the right ear and the left ear of the user from at least the external signal, and also to generate the output signal for the other ear from at least the audio signal.

Moreover, the mode setting portion also may set, as the operation mode in place of the external mode, at least an audio mode corresponding to the output signal, and when the audio mode is set, the fade control portion may cause the output signal generation portion to generate the stereo output signal from the stereo audio signal.

The signal processing device may further include a noise canceling signal generation portion that, based on the external signal acquired by the external signal acquisition portion, generates a noise canceling signal that reduces the external sound represented by the external signal. The output signal generation portion, to reduce the external sound, may superimpose the noise canceling signal on the output signal that is generated from the audio signal.

Moreover, the external signal acquisition portion may acquire the stereo external signal. The signal processing device may further include a direction specification portion that, when the external mode is set, specifies a direction of an emission source of the external signal with respect to the user, based on the stereo external signal acquired by the external signal acquisition portion. The fade control portion, in accordance with the direction of the emission source specified by the direction specification portion, may determine, of the output signals for the right ear and the left ear of the user, the output signal for the other ear generated from the external signal.

Moreover, when the direction specification portion specifies that the direction of the emission source is in a flat plane including a forward and a backward direction with respect to the user, the fade control portion may cause the output signal generation portion to generate the output signal for the right ear by superimposing the audio signal for the right ear and the external signal for the right ear, and also to generate the output signal for the left ear by superimposing the audio signal for the left ear and the external signal for the left ear.

Moreover, when the external mode is set, the fade control portion may cause the output signal generation portion to generate the output signal for one of the right and left ears from the external signal only, and to generate the output signal for the other ear by converting the stereo audio signal to the monaural audio signal.

Moreover, the mode setting portion may switch between the audio mode and the external mode in accordance with operation by the user.

Moreover, the signal processing device may further include an information signal acquisition portion that acquires, from an external information transmission device, an information signal that is different to the audio signal and the external signal and that represents audio information to be provided to the user. When the information signal acquisition portion has acquired the information signal, the mode setting portion may set, as the operation mode, an information mode corresponding to the generated output signal, and when the information mode is set, the fade control portion may cause the output signal generation portion to generate the output signal for one of the right and left ears from at least the information signal, and also to generate the output signal for the other ear from at least the audio signal.

Moreover, the signal processing device may further include an audio recognition portion that acquires the external signal in the audio mode, and determines whether a predetermined audio signal is included in the external signal. When it is determined that the predetermined audio signal is included in the external signal, the mode setting portion may switch to the external mode as the operation mode.

Moreover, of the stereo output signals, corresponding to the output signal for the right ear and the output signal for the left ear, respectively, the output signal generation portion may include an audio signal adjustment portion that has a plurality of faders that adjust a volume that contains, respectively, the right ear audio signal and the left ear audio signal of the stereo audio signals, and an external signal adjustment portion that has a plurality of faders that adjust a volume that contains, respectively, the right ear external signal and the left ear external signal of the stereo external signals.

According to another embodiment of the present invention, there is provided a signal processing method which includes the steps of acquiring an audio signal representing stereo audio content, acquiring an external signal representing external sound obtained by collecting ambient sound, setting at least an external mode corresponding to an output signal representing stereo audio that is provided to a user, and in accordance with the operation mode set in the mode setting step, generating, from the audio signal acquired in the audio signal acquiring step and from the external signal acquired in the external signal acquiring step, the output signal representing the stereo audio provided to the user. In the output signal generating step, when the external mode is set, the output signal for one of the right ear and the left ear of the user is generated from at least the external signal, and also, the output signal for the other ear is generated from at least the audio signal.

According to another embodiment of the present invention, there is provided a program that comprises instructions that command a computer to function as an audio signal acquisition device that acquires an audio signal representing stereo audio content, an external signal acquisition device that acquires an external signal representing external sound obtained by collecting ambient sound, an output signal generation device that generates, from the audio signal acquired by the audio signal acquisition device and the external signal acquired by the external signal acquisition device, an output signal representing stereo audio provided to a user, a mode setting device that sets, as an operation mode of the output signal generation device, at least an external mode corresponding to the generated output signal, and a fade control device that controls an operation to generate the output signal by the output signal generation device, in accordance with the operation mode set by the mode setting device. When the external mode is set, the fade control device causes the output signal generation device to generate the output signal for one of the right ear and the left ear of the user from at least the external signal, and also to generate the output signal for the other ear from at least the audio signal.

According to the above-described present invention, it is possible to reduce discomfort and inconvenience caused by interruption of listening to audio such as music etc. while also providing peripheral sound.

DETAILED DESCRIPTION OF THE EMBODIMENT(S)

Figure 1:
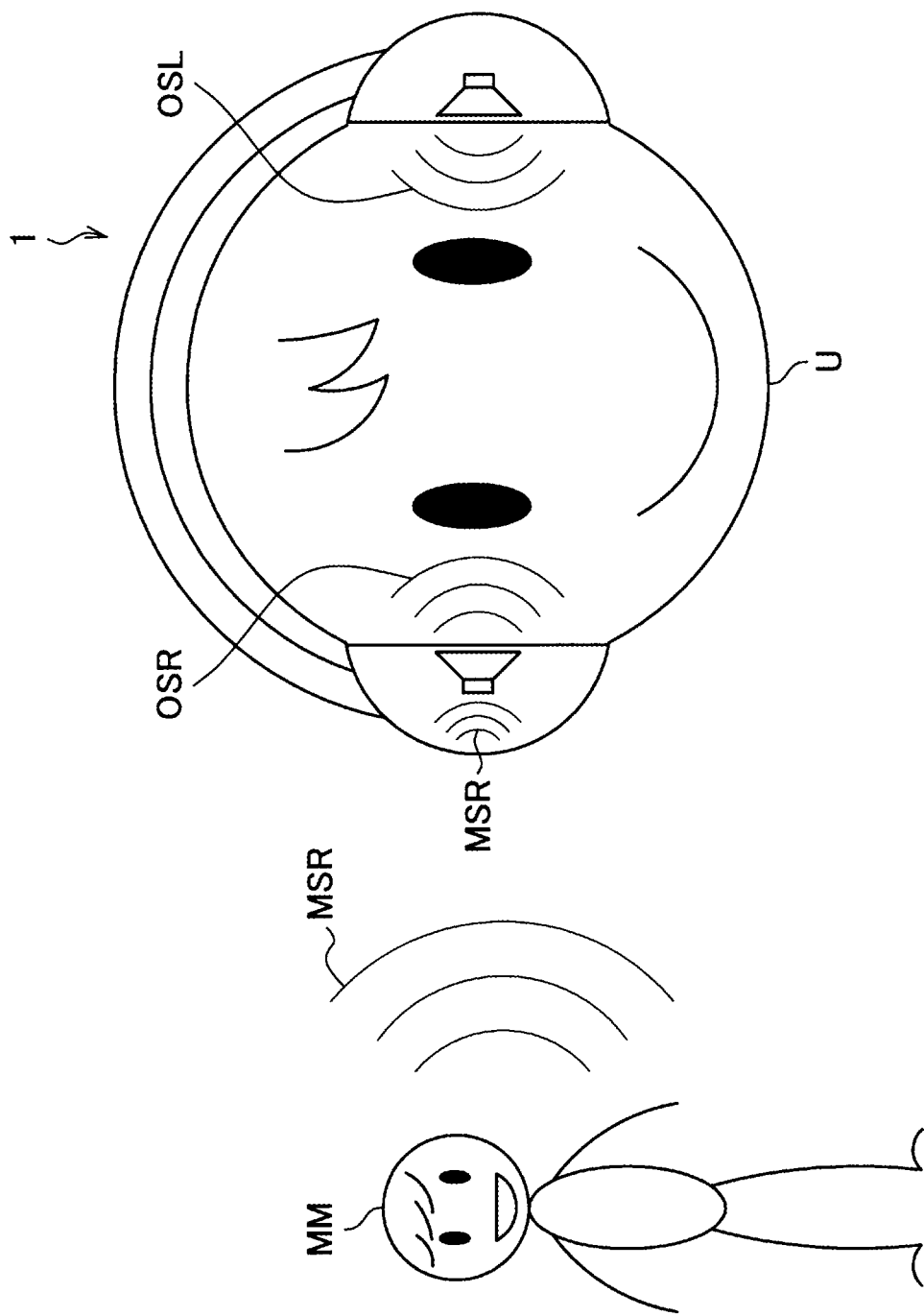
FIG. 1 is an explanatory diagram illustrating an outline of headphones according to each embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

A signal processing device according to each embodiment of the present invention can be embodied in a variety of forms. The signal processing device can be embodied, for example, as headphones, such as outer ear headphones, inner ear headphones, earphones, headsets and the like. Further, other examples of the signal processing device can be, for example, a mobile telephone, a mobile player, a computer or a personal data assistant (PDA) etc. that provide an audio signal to the above-mentioned headphones. In addition, when the signal processing device is one of these terminals or the like, the signal processing device can be embodied as a digital signal processor (DSP) of that terminal. In other words, each embodiment of the present invention can be realized by a variety of devices or terminals that can provide an audio signal etc. to a user. However, in order to simplify an explanation of the signal processing device according to each embodiment of the present invention, the explanation given below is an example in which the signal processing device is realized by headphones 1.

Similarly to normal headphones etc., the headphones 1 according to each embodiment can acquire "audio signals S, SL and SR" that represent stereo audio content from an external audio signal playback device or the like, and can provide the acquired audio signals as actual sound to a user (a wearer). Note that the audio content that represents the audio signals can be various, including, for example, music, a radio broadcast, a television broadcast, education material such as English conversation, entertainment content such as a comic monologue, audio for a game, audio for animation, operating sounds for a computer etc., and is not limited to any particular content. In addition, the headphones 1 according to each embodiment can also supply ambient sound to the user, as appropriate. In this case, ambient sound is referred to as "external sound MS, MSL and MSR" and signals that are obtained by collecting the external sound are referred to as "external signals M, ML and MR". Moreover, audio that is generated by the headphones 1 and is actually provided to the user by driving speakers etc. is referred to as "output audio OS, OSL and OSR," and signals representing the output audio are referred to as "output signals O, OL, OR".

Note that, as the audio signals are supplied in stereo, the audio signal for the user's left ear is referred to as the audio signal SL and the audio signal for the user's right ear is referred to as the audio signal SR. On the other hand, when no distinction is made between the two audio signals, they are referred to as the audio signal S. Similarly, as the output signal and the output audio are also stereo, when they are simply referred to as the output signal O and the output audio OS, no distinction is made between the left and the right. Meanwhile, when the output signal OL and the output audio OSL, or when the output signal OR and the output audio OSR are referred to, they represent signals and audio for the left ear and the right ear, respectively. In addition, depending on the situation and conditions etc., the external signal and the external sound are sometimes monaural and sometimes stereo. For that reason, when they are stereo, the signals and sound for the left ear are referred to as the external signal ML and the external sound MSL, and the signals and sound for the right ear are referred to as the external signal MR and the external sound MSR. In contrast, when no distinction is made between the left and right, or when the signals and sound are monaural, they are referred to as the external signal M and the external sound MS.

To simplify an understanding of the headphones 1 according to each embodiment of the present invention, exemplary embodiments will be explained in the following order.
1. Outline of headphones according to each embodiment of the present invention
2. First embodiment
   2-1. Structure of headphones
   2-2. Structure of control portion
   2-3. Structure of output signal generation portion
   2-4. Operations of headphones
      2-4-1. Operation in audio mode
      2-4-2. Operation in external mode
      2-4-3. Operation when ending external mode
      2-4-4. Operation in information mode
   2-5. Example of effects
3. Second embodiment
4. Third embodiment

1. Outline of Headphones According to Each Embodiment of the Present Invention FIG. 1 is an explanatory diagram illustrating an outline of the headphones 1 according to each embodiment of the present invention. As described above, the signal processing device according to each embodiment of the present invention is embodied as the headphones 1 exemplified in FIG. 1. In FIG. 1, a wearer of the headphones 1 is a user U, and here an emission source of the external sound MSR that the user U wishes to listen to is an originator MM.

Note that the external sound MSR is not necessarily a voice emitted by a person, and may be, for example, a broadcast announcement, a sound from a mobile telephone receiver, a siren of an emergency vehicle, or may simply be noise, or any sound that can be recognized as a sound.

When the user is listening to the output audio OSL, OSR generated from audio signals, it is difficult for the user to recognize this type of external sound MSR. Furthermore, when a noise canceling function is in operation for increased enjoyment of audio content represented by the audio signals, it is even more difficult for the user to recognize the external sound MSR.

Figure 2A:
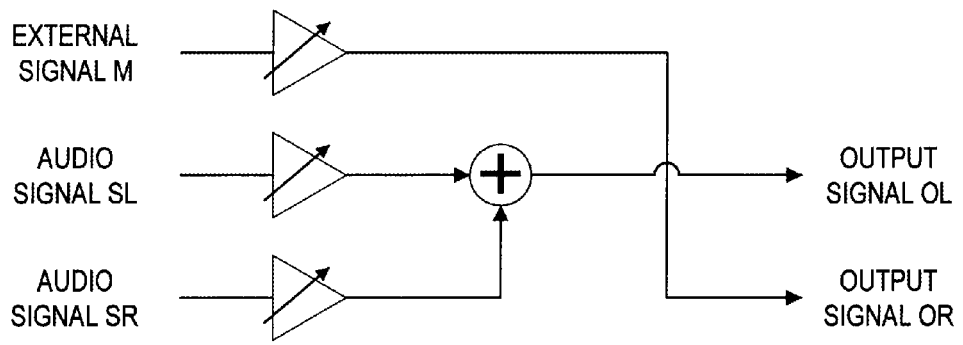
FIG. 2A is an explanatory diagram illustrating an outline of the headphones according to each embodiment of the present invention.
Figure 2B:
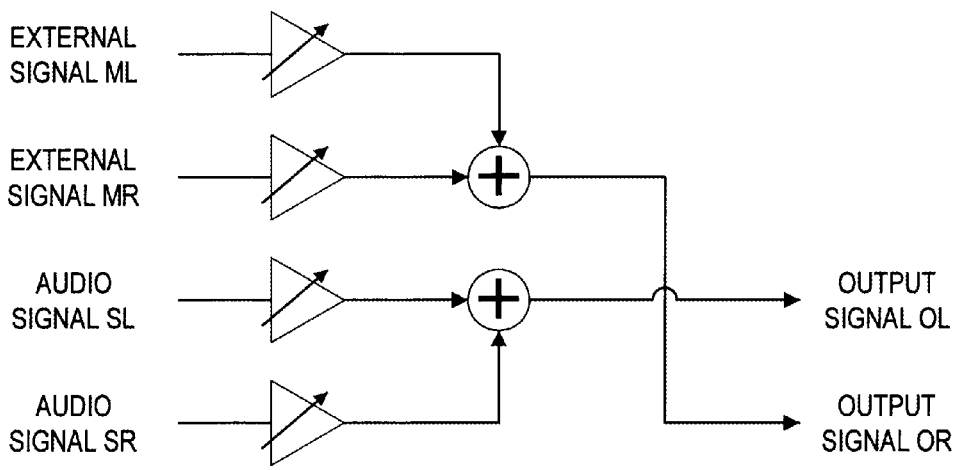
FIG. 2B is an explanatory diagram illustrating an outline of the headphones according to each embodiment of the present invention.

With respect to these difficulties, an outline of the headphones 1 according to each embodiment of the present invention is shown in FIG. 2A and FIG. 2B. When the external sound MS is monaural, as shown in FIG. 2A, the headphones 1 output the external signal M as the output signal OR of the right direction in which the originator MM is positioned. Meanwhile, the headphones 1 convert the stereo audio signals SL and SR to monaural audio and output it as the output signal OL of the left direction, namely the different direction to that in which the originator MM is positioned.

On the other hand, when the external sound MSL and MSR are stereo, as shown in FIG. 2B, the headphones 1, while converting the stereo external signals ML and MR to monaural, output the audio as the output signal OR of the right direction in which the originator MM is positioned. The output signal OL is converted by the headphones 1 to monaural from the stereo audio signals SL and SR and is output in a similar way to that described above.

As a result, the user U can listen to the external sound MS as the output audio OSR corresponding to the direction of the originator MM of the external sound MSR. At the same time, the user U can listen to the audio signal S that is converted to monaural as the other output audio OSL. In this way, the user U can listen to the external sound MS without any need to perform an inconvenient operation, such as removing the headphones 1, and further, without experiencing any discomfort caused by interruption of listening to the audio content, or losing audio on one of either the left or the right side. In addition, from the direction of the output audio OSR of the side on which the external sound MS is provided, the user U can be aware of the direction of the emission source of the external sound MS.

Note that when the normal stereo audio signals SL and SR are output as the stereo output signals OL and OR, the operation mode of the headphones 1 is here referred to as the "audio mode". Further, when the external signal M is provided as at least one of the output signals OL and OR, as shown in FIG. 2A and FIG. 2B, the operation mode of the headphones 1 is here referred to as the "external mode". In addition, as will be explained later, in the external mode, the headphones 1 can provide, in place of the external signal M, predetermined information acquired externally as at least one of the output signals OL and OR. In this case, the operation mode of the headphones 1 is referred to here as the "information mode".

Hereinafter, the headphones 1 according to each embodiment of the present invention will be described in more detail. However, the operations and effects of the headphones 1 described herein are simply individual examples, and it goes without saying that the headphones 1 according to each embodiment are not limited only to the examples herein, and similar operations and effects may be otherwise realized.

2. First Embodiment 2-1. Structure of Headphones

Figure 3:
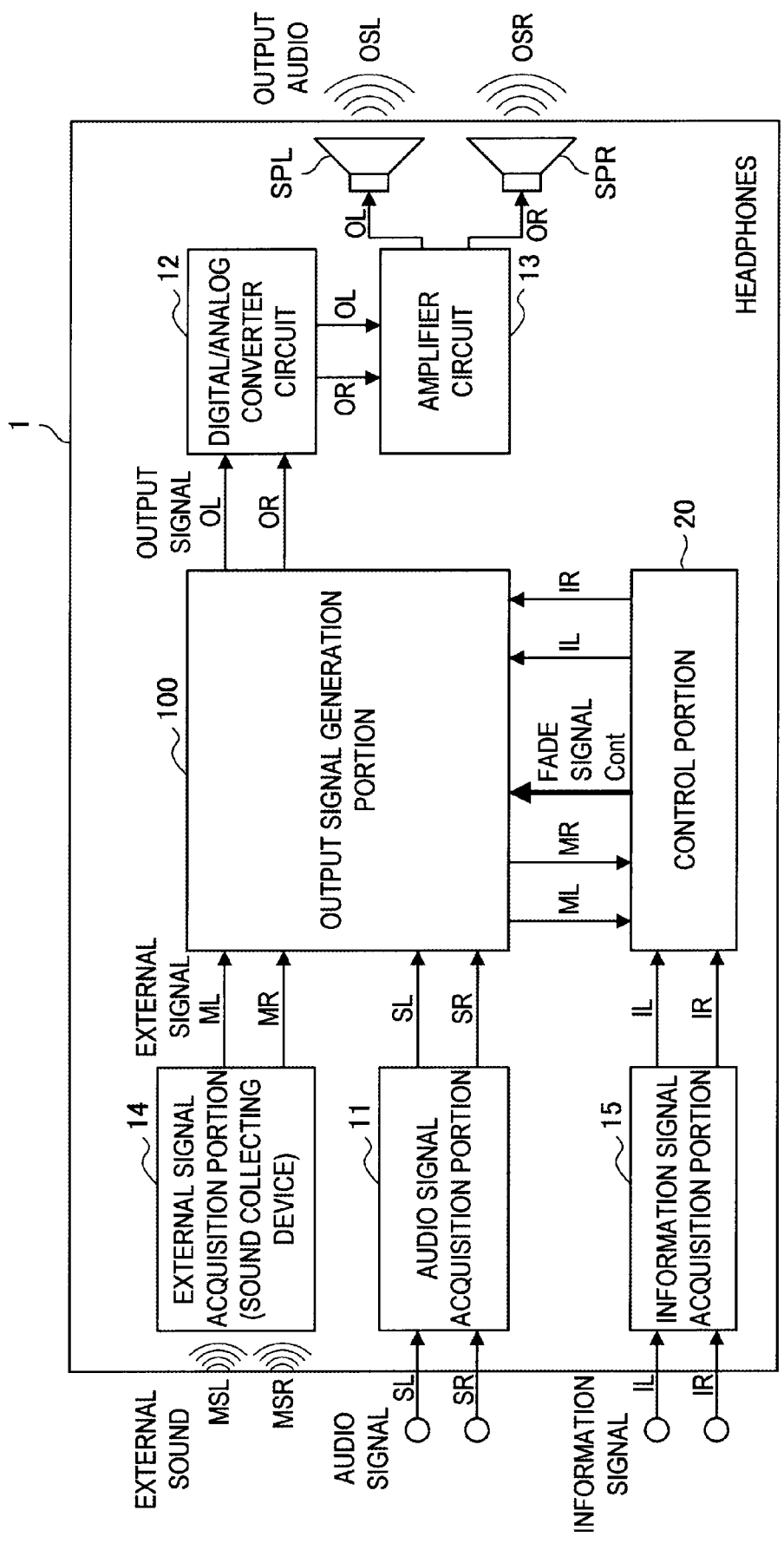
FIG. 3 is an explanatory diagram illustrating an outline of the headphones according to a first embodiment of the present invention.

FIG. 3 is an explanatory diagram illustrating the structure of the headphones 1 according to a first embodiment of the present invention. As shown in FIG. 3, the headphones 1 according to the present embodiment include an audio signal acquisition portion 11, a digital/analog converter circuit 12, an amplifier circuit 13, an external signal acquisition portion 14, an information signal acquisition portion 15, a control portion 20, an output signal generation portion 100 and speakers SPL and SPR.

The audio signal acquisition portion 11 acquires the audio signals SL and SR that represent stereo audio content. In the case of the headphones 1, the audio signal acquisition portion 11 can be formed as an input terminal. Alternatively, when the signal processing device according to each embodiment of the present invention has a playback function and a broadcast wave reception function, the audio signal acquisition portion 11 can also be realized as the playback function and the broadcast wave reception function. The audio signals SL and SR acquired by the audio signal acquisition portion 11 are transmitted to the output signal generation portion 100.

Note that, here, the audio signals SL, SR and the other signals, namely the external signals ML, MR and the information signals IL, IR are digital signals.

When in the audio mode, the output signal generation portion 100 generates the output signal OL from the audio signal SL and generates the output signal OR from the audio signal SR. Operations of the output signal generation portion 100 in the other modes will be explained later as appropriate. The output signals OL and OR generated by the output signal generation portion 100 are transmitted to the digital/analog converter circuit 12.

The digital/analog converter circuit 12 converts the digital output signals OL and OR generated by the output signal generation portion 100 to the analog output signals OL and OR. Then, the converted output signals OL and OR are transmitted to the amplifier circuit 13.

The amplifier circuit 13 amplifies the analog output signals OL and OR converted by the digital/analog converter circuit 12 in accordance with a predetermined amplification factor or with an amplification factor set by the user U. The amplified output signals OL and OR are respectively output to the left speaker SPL and the right speaker SPR, and are then provided to the user U as the output audio OSL and OSR from the speakers SPL and SPR. Note that the above-described digital/analog converter circuit 12 and amplifier circuit 13 may be formed, for example, as an integrated unit, such as a digital amplifier or the like.

Meanwhile, the external signal acquisition portion 14 acquires the external sounds MSL and MSR obtained by collecting peripheral sound. Note that, when the headphones 1 according to the present embodiment have a noise canceling function, the external signal acquisition portion 14 can be structured as a sound collection device (not shown in the figures), such as speakers provided for the noise canceling function. Note also that the sound collection device is provided, for example, in both left and right housings of the headphones 1, and the external sound MS can be collected in stereo to the left and the right of the headphones 1. The external signal acquisition portion 14 then converts the collected external sound MSL and MSR to the digital external signals ML and MR. It should be noted that the external signal acquisition portion 14, as the sound collection device, may be one of a feedback and a feed forward device for the noise canceling function. Expressed differently, in contrast to the example given above, when the headphones 1 do not have the noise canceling function, the external signal acquisition portion 14 can be structured as a dedicated sound collection device or as a connected terminal that acquires the external signals ML and MR from an external sound collection device. The external signals ML and MR acquired by the external signal acquisition portion 14 are transmitted to the output signal generation portion 100.

In the audio mode, in order to reduce noise (peripheral sound, the external sound MS) that the user U listens to along with the output audio OSL and OSR generated from the audio signals SL and SR, the above-described output signal generation portion 100 generates left and right noise canceling (NC) signals NL and NR. Then, the output signal generation portion 100 respectively superimposes the NC signals NL and NR on the output signals OL and OR generated from the audio signals SL and SR.

On the other hand, in the external mode, the output signal generation portion 100 extracts, from the external signals ML and MR, the external sounds MSL and MSR that should be provided to the user U. The output signal generation portion 100 then generates, from at least the external signal M, the output signal O for one of either the right ear or the left ear of the user U. In addition, the output signal generation portion 100 generates, from at least the above-described audio signal S, the output signal O for the other ear.

In a different manner to the audio signal S and the external signal M, the information signal acquisition portion 15 acquires the information signals IL and IR that represent sound information that should be provided to the user U from an external information transmission device (not shown in the figures). For that reason, the information signal acquisition portion 15 is provided with a function to communicate with the information transmission device via wired or wireless communication. In this case, the information signal acquisition portion 15 may be capable of communication with the information transmission device via a network, or may be directly capable of communication with the information transmission device. Note that various types of information can be used as the audio information. For example, information signals can be disaster information or emergency information (the use of which is becoming more widespread in recent years), such as an earthquake early warning. Alternatively, the information signals can be navigation information representing a route from a current location to a target location, or arrival information representing the arrival of a train etc. at a specified station. Furthermore, when the signal processing device according to the present embodiment is a mobile telephone, the information signal acquisition portion 15 can be structured as a communication function, and can output ringing tones or conversation as information signals. Similarly to the audio signal S and the external signal M, it is preferable for these information signals IL and IR to be digital signals that represent the information as sound. However, they do not need to be stereo and may be monaural.

The information signals IL and IR acquired by the information signal acquisition portion 15 are transmitted to the control portion 20 and, in the information mode, the control portion 20 outputs the information signals IL and IR to the output signal generation portion 100.

At this time, in place of the external signals ML and MR in the external mode, the output signal generation portion 100 uses the information signals IL and IR. In other words, the output signal generation portion 100 generates, from at least the information signals IL and IR, the output signal O for one of either the right ear or the left ear of the user U. Further, the output signal generation portion 100 generates, from at least the above-described audio signal S, the output signal O for the other ear.

In this way, in accordance with the set operation mode, the output signal generation portion 100 switches and generates the output signals OL and OR. Expressed differently, as the operation modes of the output signal generation portion 100, each mode (the audio mode, the external mode and the information mode) is set corresponding to the output signals OL and OR that are generated. The control portion 20 performs switching of the mode in this way and operation control of the output signal generation portion 100. Thus, the control portion 20 will be explained next, and a more specific example will then be given of the structure of the output signal generation portion 100.

2-2. Structure of Control Portion

Figure 4:
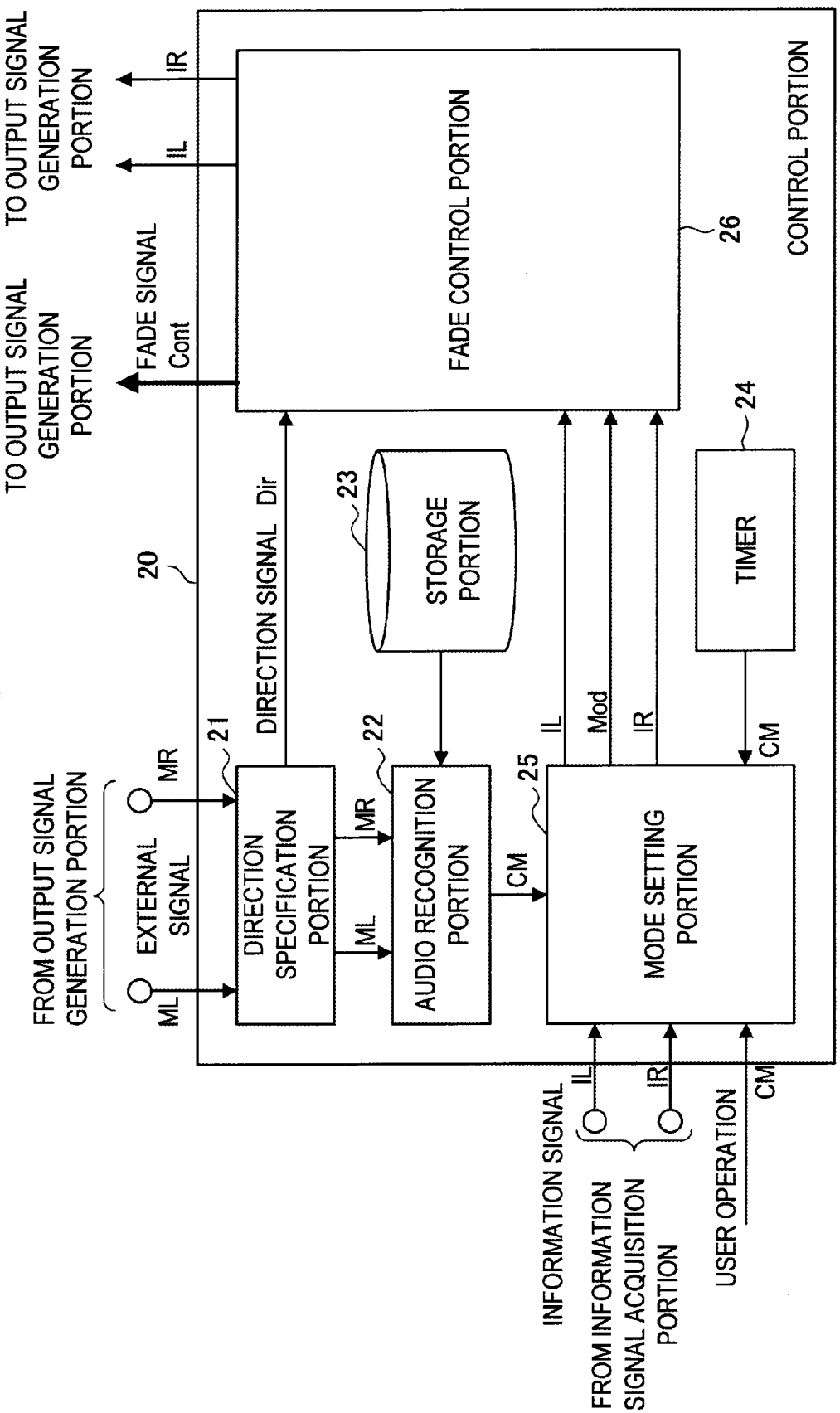
FIG. 4 is an explanatory diagram illustrating the structure of a control portion of the headphones according to the first embodiment.

FIG. 4 is an explanatory diagram illustrating the structure of the control portion 20 of the headphones 1 according to the present embodiment. As shown in FIG. 4, the control portion 20 of the headphones 1 according to the present embodiment includes a direction specification portion 21, an audio recognition portion 22, a storage portion 23, a timer 24, a mode setting portion 25 and a fade control portion 26.

The direction specification portion 21 specifies, at least when the external mode is set, the direction of the originator MM (also sometimes referred to as the "originator direction") with respect to the user U, namely with respect to the headphones 1. The originator MM is the origin of the external signals ML and MR, and the direction specification portion 21 specifies the above direction based on the stereo external signals ML and MR acquired by the external signal acquisition portion 14. In other words, the direction specification portion 21 acquires the external signals ML and MR and compares data of the two signals. It then specifies the external signal with the larger volume as being the originator direction. Note that the output signal generation portion 100 extracts, from the external signals ML and MR, the external sound MS that should be provided to the user U (a person's voice, for example). This process will be explained later. Here, the external signals ML and MR following this extraction are also referred to as the external signals ML and MR. In this case, it is preferable for the direction specification portion 21 to acquire the external signals ML and MR after extraction, and use these signals to specify the originator direction. The direction specification portion 21 outputs a direction signal Dir, representing the specified originator direction, to the fade control portion 26.

In the audio mode, the audio recognition portion 22 acquires the external signals ML and MR after extraction from the direction specification portion 21 or the output signal generation portion 100, and determines whether or not the external signals ML and MR include a predetermined audio signal. Then, when this type of the predetermined audio signal is included, the audio recognition portion 22 outputs a mode switchover signal CM to the mode setting portion 25 that instructs switching of the operation mode to the external mode.

Note that examples of the audio that represents the predetermined audio signal are, for example, a emergency vehicle siren, normal content of a voice emitted by a store salesperson, a voice or sound of content notifying an emergency situation, and sound of a predetermined frequency or pattern set in advance by the user. Note also that information of the predetermined audio signal is stored in advance in the storage portion 23. Then, when, for example, the characteristic amount of the external signals ML and MR (the frequency and waveform, text data after speech recognition etc.) and the characteristic amount of the stored information are equal, the audio recognition portion 22 can detect the predetermined audio signal.

The timer 24 is set by the user U, and at a time point at which a predetermined time period elapses, the timer 24 transmits a mode switchover signal CM to the mode setting portion 25 that instructs switching of the operation mode to the external mode, the audio mode or the information mode.

As the operation mode of the output signal generation portion 100, the mode setting portion 25 sets one of the audio mode, the external mode or the information mode, in accordance with the generated output signals OL and OR. Then, the mode setting portion 25 outputs, to the fade control portion 26, mode information Mod that represents the set operation mode.

Timing of the switching of the operation mode by the mode setting portion 25 will now be explained.

The operation mode switchover timing can be set to various timings, but, in the present embodiment, at least four switchover timings are set for the timing of the switching from the audio mode to another of the modes.

As a first switchover timing, the mode setting portion 25 can switch the operation mode from the audio mode to the external mode or the information mode in accordance with a mode switchover signal CM input by operation of the user U.

In this case, the user U operates an operation portion (not shown in the figures) and the mode setting portion 25 acquires the mode switchover signal CM that is an operation signal input from the operation portion. Then, the mode setting portion 25 switches the operation mode to the mode (the external mode or the information mode) represented by the mode switchover signal CM.

A second switchover timing is a case in which it is determined by the audio recognition portion 22 that the predetermined audio signal is included in the external signals ML and MR. In other words, when the mode switchover signal CM is acquired from the audio recognition portion 22, the mode setting portion 25 can switch the operation mode from the audio mode to the external mode.

A third switchover timing is a case in which the mode switchover signal CM is input to the mode setting portion 25 from the timer 24. Note here that, for the mode switchover signal CM output from the timer 24, by allocating signals corresponding to the external mode and the information mode, the mode setting portion 25 can switch the operation mode from the audio mode to the external mode or the information mode.

A fourth switchover timing is a case in which, when the information signal acquisition portion 15 has acquired the information signals IL and IR, the mode setting portion 25 can switch the operation mode to the information mode. Note here that FIG. 4 exemplifies a case in which, when the mode setting portion 25 acquires the information signals IL and IR, it switches the operation mode to the information mode. However, the mode switchover signal CM can be used with the fourth switchover timing also, similarly to the above-described other timings. In this case, when the information signal acquisition portion 15 acquires the information signals IL and IR, the mode switchover signal CM is output to the mode setting portion 25, but the information signals IL and IR may be transmitted directly from the information signal acquisition portion 15 to the output signal generation portion 100.

It must be noted that the timings explained here for switching from the audio mode to other modes are simply examples and it goes without saying that a variety of other applications are conceivable. Furthermore, it is possible to set various combinations for switching from one of the other modes (other than the audio mode) to another mode, by using the mode switchover signal CM or the like in a similar manner to that described above.

In addition, various settings can be made for switching to the audio mode from a state in which the external mode or the information mode is set, such as the mode switchover signal CM in accordance with user operation, the mode switchover signal CM output from the timer 24 or switching over when the external signal or the information signal is no longer input etc.

The fade control portion 26 controls the generation of the output signals OL and OR by the output signal generation portion 100, in accordance with the operation mode set by the mode setting portion 25. As will be explained later, the output signal generation portion 100 has a plurality of faders used to adjust respective volume levels of the audio signals SL and SR, the external signals ML and MR and the information signals IL and IR that are included in the output signals OL and OR. The fade control portion 26, in accordance with the operation mode (also including the originator direction in certain cases), transmits, to the output signal generation portion 100, a fade signal Cont that changes the volume level adjusted by each of the faders.

As described above, in the external mode, the output signal generation portion 100 extracts, from the external signals ML and MR, the external sound MSL and MSR that should be provided to the user U. The output signal generation portion 100 then generates, from at least the external signal M, the output signal O for one of either the right ear or the left ear of the user U. At that time, in accordance with the direction of the originator MM specified by the direction specification portion 21, the fade control portion 26 determines, of the output signals OL and OR for the left ear and the right ear of the user U, the output signal to be generated from the external signal M. Thus, in the external mode, by the fade control portion 26 adjusting the fade signal Cont, adjustment can be made such that the external signal M is included in the output signals OL and OR corresponding to the originator direction specified by the direction specification portion 21.

In other words, for example, when the originator direction is to the left side of the user U (namely when it is to the left side of the headphones 1), the output signal generation portion 100 includes the external signal M in at least the left channel output signal OL.

On the other hand, when the originator direction is to the right side of the user U (namely when it is to the right side of the headphones 1), the output signal generation portion 100 includes the external signal M in at least the right channel output signal OR. In addition, for example, when the originator direction is not biased to either the left or the right side of the user U (namely, when the originator direction is in a single plane that includes the directions to the front and rear of the user U), the output signal generation portion 100 includes the external signal M in both the left and the right channel output signals OL and OR.

Note that, in this case, when the originator direction is to the left side or the right side of the user U, the output signal generation portion 100 converts the stereo audio signals SL and SR to monaural and includes the monaural audio signal S in the channel of the output signals OL and OR that does not include the external signal M.

On the other hand, when the originator direction is not biased to either the left side or the right side of the user U, the external signal M is included in both channels of the output signals OL and OR. In this case, the output signal generation portion 100 further includes, in both channels of the output signals OL and OR respectively, the audio signals SL and SR corresponding to each channel. As a result, the output signal generation portion 100 superimposes the external signal ML on the audio signal SL and generates the output signal OL, and superimposes the external signal MR on the audio signal SR and generates the output signal OR.

Note that a manner in which each of the faders of the output signal generation portion 100 is controlled by the fade signal Cont output by the fade control portion 26 will be described in more detail using specific examples of the operations of the headphones 1. This explanation will be made after an explanation of the structure of the output signal generation portion 100.

2-3. Structure of Output Signal Generation Portion

Figure 5:
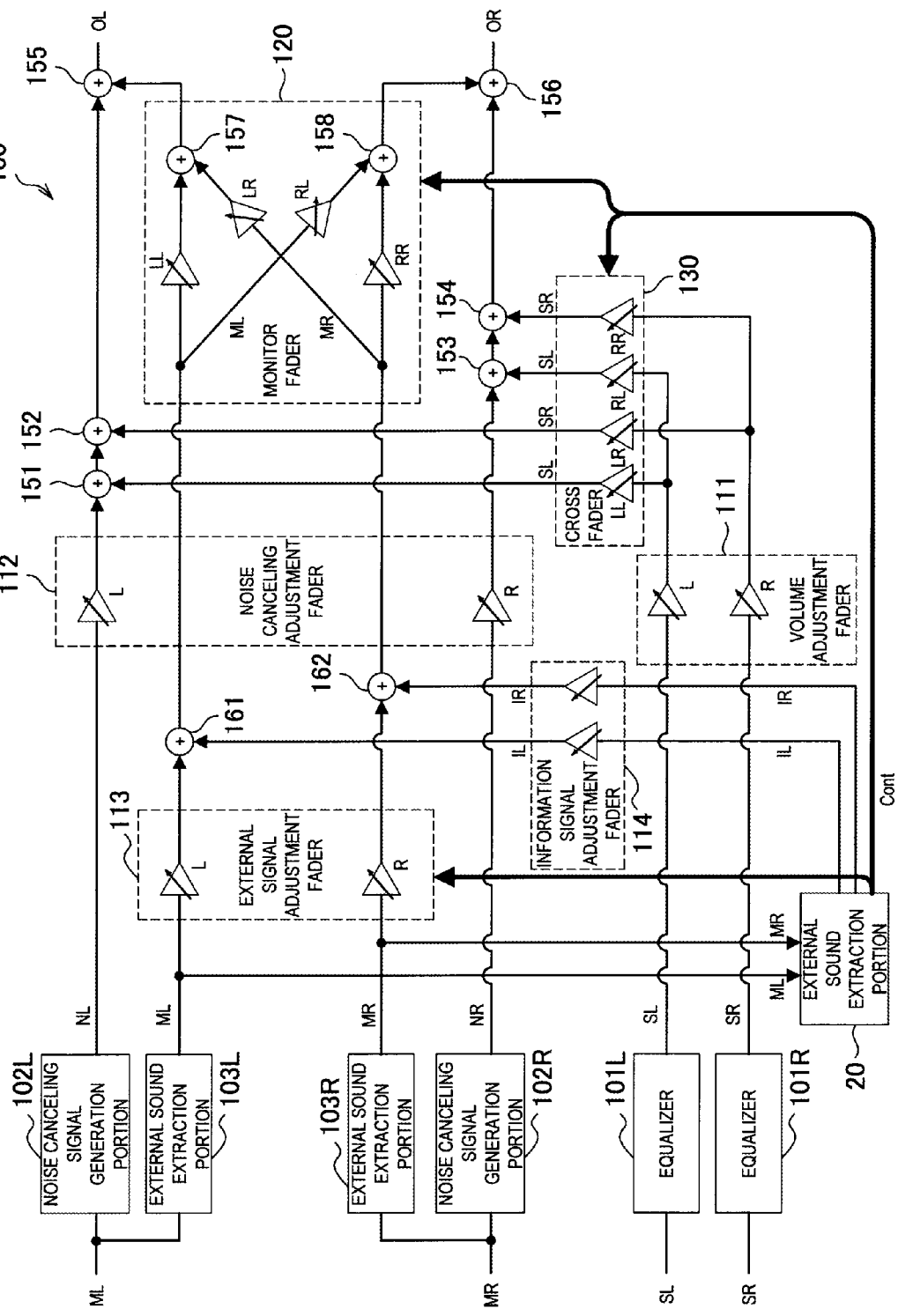
FIG. 5 is an explanatory diagram illustrating the structure of an output signal generation portion of the headphones according to the first embodiment.

FIG. 5 is an explanatory diagram illustrating the structure of the output signal generation portion 100 of the headphones 1 according to the present embodiment. Note that the structure of the output signal generation portion 100 shown in FIG. 5 is one example and it goes without saying that a variety of circuit structures are possible as long as they can perform the operations in a similar way to that described above.

In the example of the structure of the output signal generation portion 100 shown in FIG. 5, the output signal generation portion 100 includes equalizers 101L and 101R, noise canceling signal generation portions 102L and 102R, external sound extraction portions 103L and 103R, a volume adjustment fader 111, a noise canceling adjustment fader 112, an external signal adjustment fader 113, an information signal adjustment fader 114, a monitor fader 120, a cross fader 130 and adding circuits 151 to 158.

First, a line of the audio signals SL and SR will be explained.

The equalizers 101L and 101R are respectively arranged on left and right channels and acquire the audio signals SL and SR that correspond to each channel from the audio signal acquisition portion 11. Then, the equalizers 101L and 101R change the frequency characteristics of each of the audio signals SL and SR. The equalizers 101L and 101R change the frequency characteristics of each of the audio signals SL and SR to frequency characteristics set in advance or to frequency characteristics set by the user U. Note that, depending on the settings, the equalizers 101L and 101R can also output each of the audio signals SL and SR without changing the frequency characteristics.

The volume adjustment fader 111 is one example of a volume adjustment portion, and it has two faders one of which is arranged on the left channel and the other of which is arranged on the right channel. Each of the faders acquires the audio signals SL and SR for each of the channels from the equalizers 101L and 101R. Then, the volume adjustment fader 111 adjusts the volume level of the audio signals SL and SR for each of the channels to a value set by the user U.

Note that, hereinafter, for explanatory convenience, the left channel will also be referred to as the "L channel" and the right channel will also be referred to as the "R channel".

The cross fader 130 is one example of an audio signal adjustment portion, and it has a plurality of faders that can adjust each of the volume levels that include the stereo audio signals SL and SR corresponding to the output signals OL and OR, respectively. Here, it is assumed that the cross fader 130 has four faders and each fader (namely, faders LL, LR, RL and RR) will be explained in more detail.

The fader LL of the cross fader 130 acquires the L channel audio signal SL from the volume adjustment fader 111, and outputs the audio signal SL to the adding circuit 151 such that the audio signal SL is included in the L channel output signal OL.

The fader LR of the cross fader 130 acquires the R channel audio signal SR from the volume adjustment fader 111, and outputs the audio signal SR to the adding circuit 152 such that the audio signal SR is included in the crossed L channel output signal OL.

The fader RL of the cross fader 130 acquires the L channel audio signal SL from the volume adjustment fader 111 and outputs the audio signal SL to the adding circuit 153 such that the audio signal SL is included in the crossed R channel output signal OR.

The fader RR of the cross fader 130 acquires the R channel audio signal SR from the volume adjustment fader 111 and outputs the audio signal SR to the adding circuit 154 such that the audio signal SR is included in the R channel output signal OR.

At this time, the faders LL, LR, RL and RR of the cross fader 130 can each adjust the volume level of the audio signals that should be included in the output signals OL and OR of each channel.

Next, a line of the external signals ML and MR will be explained.

The noise canceling signal generation portions 102L and 102R are arranged on the left and right channels, respectively, and they acquire, respectively, the external signals ML and MR corresponding to each channel from the external signal acquisition portion 14. Then, based on the external signals ML and MR, the noise canceling signal generation portions 102L and 102R generate the NC signals NL and NR to reduce the external sound MS represented by the external signals ML and MR. The external sound MS includes noise emitted from external noise sources etc. As a result, the external signals ML and MR contain a noise signal. Here, from that noise signal, the noise canceling signal generation portions 102L and 102R generate the NC signals NL and NR to reduce noise corresponding to each channel. In this case, the noise canceling signal generation portions 102L and 102R have a filter that is used to generate the NC signals NL and NR, and the NC signals NL and NR are generated by processing the noise signal using the filter. Note that the noise reduction characteristics are determined by the type of the filter.

Noise reduction characteristics are, for example, distribution of the noise removal ratio with respect to frequency bandwidths, the time required to generate the NC signals, and the method used to generate the NC signals etc. As an example of the processing performed by the filter, the noise signal phase is reversed. By this processing, when the NC signals are output as sound, interference occurs mutually between the output sound and the noise and they are both weakened. Note that the noise reduction characteristics and processing by the filter given here are simply examples, and the present invention is not limited to the examples described here.

Note also that for the noise reduction characteristics of the noise canceling signal generation portions 102L and 102R, it is preferable for noise reduction of the frequency bandwidth of the external sound MS extracted by the external sound extraction portions 103L and 103R (to be described later) to have more suppressed characteristics than other frequency bandwidths.

The noise canceling adjustment fader 112 has two faders one of which is arranged on the left channel and the other of which is arranged on the right channel. Each of the channel faders acquires the NC signal NL or NR corresponding to that channel. The noise canceling adjustment fader 112 is set in advance to a value at which noise is reduced to the maximum extent, and amplifies the NC signals NL and NR using that value. Note that it is preferable for the amplification factor etc. of the noise canceling adjustment fader 112 to be set to an appropriate value in advance, as described above, and the amplification factor etc. may be fixed.

The NC signals NL and NR that have been adjusted by the noise canceling adjustment fader 112 are superimposed on (mixed with) the output signals OL and OR corresponding to each channel, respectively, the signals being mixed by the adding circuits 151 to 154. As a result, regardless of a value of the cross fader 130, the NC signals NL and NR are superimposed on the output signals OL and OR and noise can be reduced.

Next, another line of the external signals ML and MR will be explained.

The external sound extraction portions 103L and 103R are arranged on the left and the right channels, respectively, and acquire, from the external signal acquisition portion 14, the external signals ML and MR corresponding to each of the channels. Then, the external sound extraction portions 103L and 103R extract external signals ML and MR of a frequency bandwidth that the user U wishes to hear, such as a person's voice, an emergency siren or the like. More specifically, the external sound extraction portions 103L and 103R have a bandpass filter or the like, and only output the external signals ML and MR of the above-described frequency bandwidth, while cutting the external signals ML and MR of other frequency bandwidths. Note that the external signals ML and MR extracted by the external sound extraction portions 103L and 103R are transmitted to the control portion 20 and are used in specifying the originator direction and so on.

The external signal adjustment fader 113 is an example of an external signal adjustment portion, and has two faders one of which is arranged on the left channel and the other of which is arranged on the right channel. Each of the faders acquires, from the external sound extraction portions 103L and 103R, the external signals ML and MR corresponding to each of the extracted channels. Then, the external signal adjustment fader 113 is set in advance to a value at which the extracted external sound MS is at an optimum volume, and amplifies the external signals ML and MR using that value. As a result, the external signal adjustment fader 113 can boost the external sound MS extracted by the external sound extraction portions 103L and 103R. Note that it is preferable for the amplification factor etc. of the external signal adjustment fader 113 to be set to an appropriate value in advance, as described above, and the amplification factor etc. may be fixed.

Note that, however, when the information mode is set, it is preferable for the external signal adjustment fader 113 to block out the external signals ML and MR.

The monitor fader 120 is an example of an external signal adjustment portion and has a plurality of faders that can adjust each of the volume levels that include the stereo external signals ML and MR (or the information signals IL and IR) corresponding to the output signals OL and OR, respectively. Here, it is assumed that the monitor fader 120 has four faders and each fader (namely, faders LL, LR, RL and RR) will be explained in more detail.

The fader LL of the monitor fader 120 acquires the L channel external signal ML from the external signal adjustment fader 113, and outputs the external signal ML to the adding circuit 155 via the adding circuit 157 such that the external signal ML is included in the L channel output signal OL.

The fader LR of the monitor fader 120 acquires the R channel external signal MR from the external signal adjustment fader 113, and outputs the external signal MR to the adding circuit 155 via the adding circuit 157 such that the external signal MR is included in the crossed L channel output signal OL.

The fader RL of the monitor fader 120 acquires the L channel external signal ML from the external signal adjustment fader 113, and outputs the external signal ML to the adding circuit 156 via the adding circuit 158 such that the external signal ML is included in the crossed R channel output signal OR.

The fader RR of the monitor fader 120 acquires the R channel external signal MR from the external signal adjustment fader 113, and outputs the external signal MR to the adding circuit 156 via the adding circuit 158 such that the external signal MR is included in the R channel output signal OR.

At this time, the faders LL, LR, RL and RR of the monitor fader 120 can each adjust the volume level of the external signals ML and MR that should be included in the output signals OL and OR of each channel.

On the other hand, when in the information mode, the information signals IL and IR are output from the control portion 20.

The information signal adjustment fader 114 is an example of an information signal adjustment portion, and has two faders one of which is arranged on the left channel and the other of which is arranged on the right channel. Each of the faders acquires the information signals IL and IR output from the control portion 20 and corresponding to each of the channels. The information signal adjustment fader 114 is set in advance to a value at which the information signals IL and IR output from the control portion 20 are at an optimum volume, and amplifies the information signals IL and IR using that value. Note that it is preferable for the amplification factor etc. of the information signal adjustment fader 114 to be set to an appropriate value in advance, as described above, and the amplification factor etc. may be fixed.

The information signals IL and IR output from the information signal adjustment fader 114 are respectively superimposed, by the adding circuits 161 and 162, on each channel of the external signals ML and MR output from the external signal adjustment fader 113. On the other hand, when acquiring the information signals IL and IR, when the information mode is set and when in the information mode, the external signal adjustment fader 113 blocks off the external signals ML and MR, as described above. As a result, in this case, in place of the external signals ML and MR, the information signals IL and IR are allocated to the output signals OL and OR while their volume levels are adjusted by the monitor fader 120.

Note here that, of the above-described structure, the external signal adjustment fader 113, the monitor fader 120 and the cross fader 130 adjust the volume level of each signal by using each fader in accordance with the fade signal Cont output by the control portion 20 in accordance with the operation mode. Although the external signal adjustment fader 113 shuts out the external signals ML and MR in the information mode, in the other modes, the external signal adjustment fader 113 amplifies the external signals ML and MR using a fixed value.

Hereinabove, the structure of the headphones 1 according to the present embodiment is explained.

Next, operations of the headphones 1 according to the present embodiment will be described.

2-4. Operations of Headphones

Figure 6:
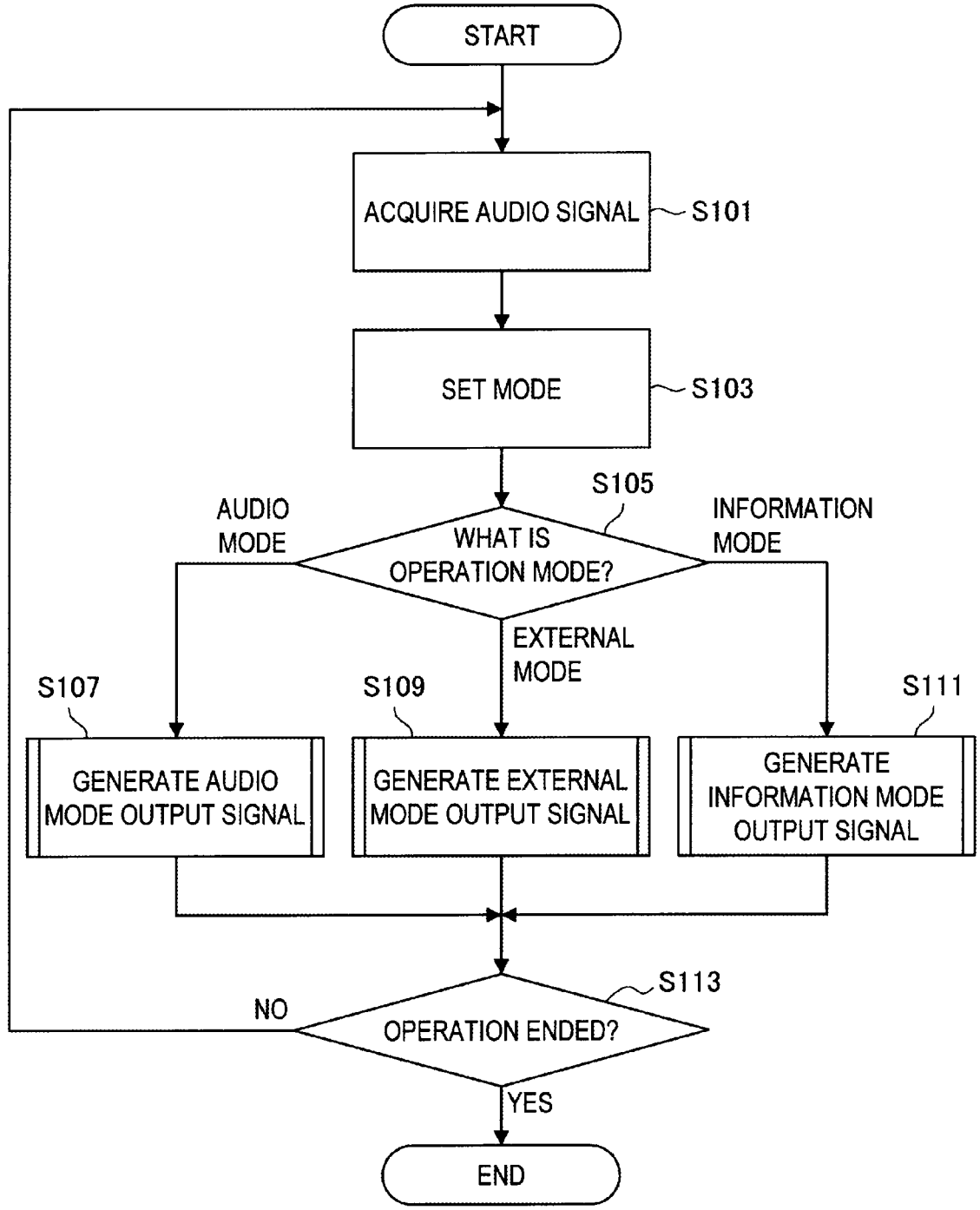
FIG. 6 is an explanatory diagram illustrating operations of the headphones according to the first embodiment.

First, an overview of the operations of the headphones 1 according to the present embodiment will be described with reference to FIG. 6. FIG. 6 is an explanatory diagram illustrating operations of the headphones 1 according to the present embodiment.

As shown in FIG. 6, when the headphones 1 start to operate, first, processing is performed at step S101 (an example of an audio signal acquiring step and an external signal acquiring step). At step S101, the audio signal acquisition portion 11 acquires the audio signals SL and SR, and the external signal acquisition portion 14 acquires the external signals ML and MR. Note that, although not shown in the figures, the external signals ML and MR are used to generate the NC signals NL and NR by the noise canceling signal generation portions 102L and 102R. The external signals ML and MR are also used to confirm, by the audio recognition portion 22, whether or not a predetermined audio signal is included. After processing at step S101, the process advances to step S103.

At step S103 (an example of a mode setting step), the mode setting portion 25 sets the operation mode depending on whether or not it has acquired the mode switchover signal CM or the information signals IL and IR. The process then advances to step S105.

At step S105, the fade control portion 26 confirms the operation mode. Then, when the operation mode is the audio mode, the process advances to step S107. When the operation mode is the external mode, the process advances to step S109, and when the operation mode is the information mode, the process advances to step S111.

At steps S107, S109 and S111 (examples of an output signal generating step), the fade control portion 26 outputs, to the output signal generation portion 100, the fade signal Cont that corresponds to each of the modes, and controls the operation of generating the output signals by the output signal generation portion 100. Values of each of the faders etc. in the output signal generation portion 100 that is controlled by the fade signal Cont will be explained in more detail for each of the modes. Meanwhile, after the processing at steps S107, S109 and S111, the process advances to step S113.

At step S113, depending on user operation or input status of audio signals, the headphones 1 determine whether or not operations have ended. When the user operation or the input status of the audio signals indicate the end of operations, operations are ended. On the other hand, when operations are not ended, the processing from step S101 onwards is repeated.

Here, operation examples of the headphones 1 will be explained for each of the modes, in the order of the audio mode, then the external mode and finally the information mode.

2-4-1. Operation in Audio Mode

Figure 7:
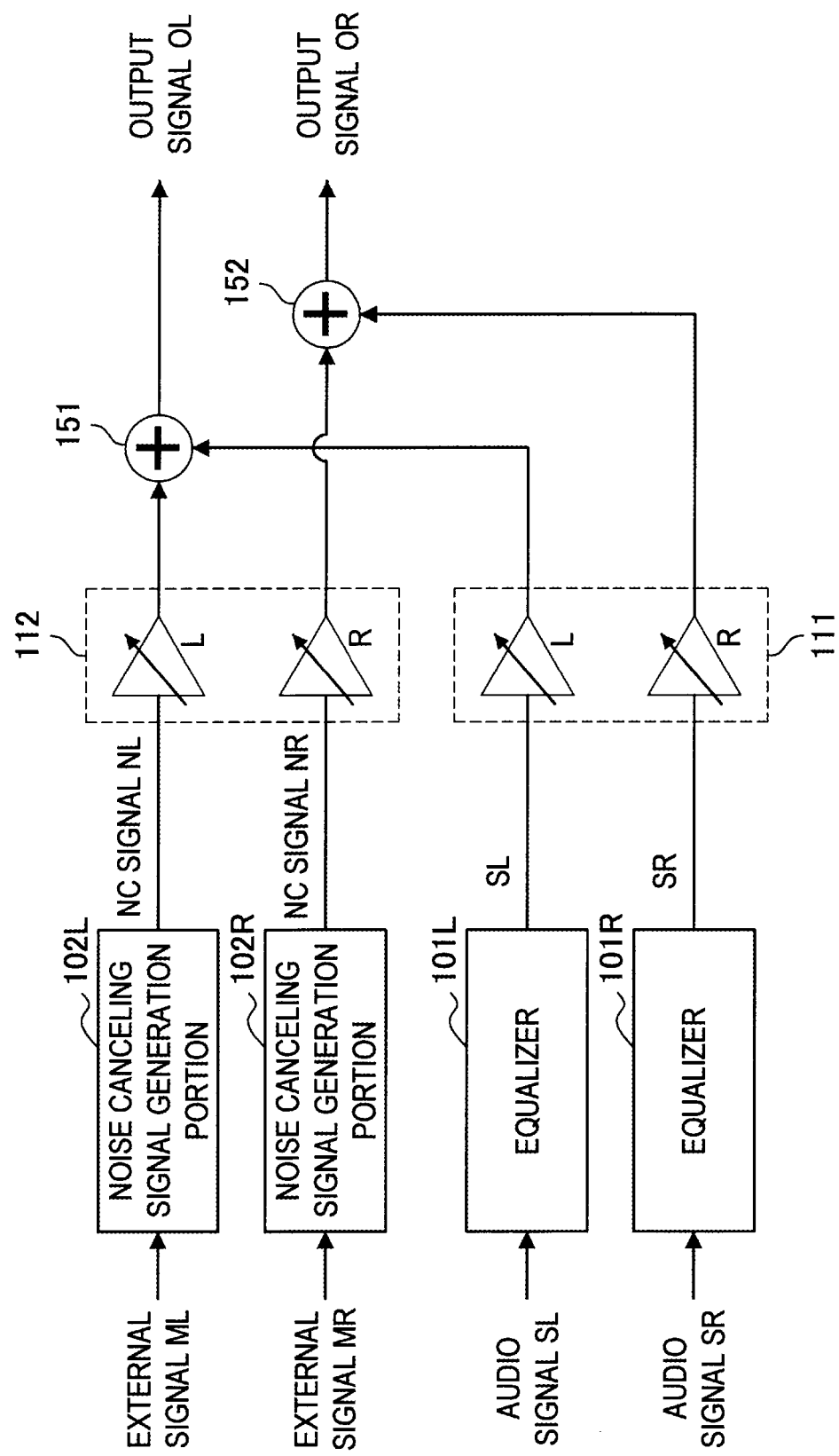
FIG. 7 is an explanatory diagram illustrating an operation in an audio mode of the headphones according to the first embodiment.

FIG. 7 is an explanatory diagram illustrating operation of the headphones 1 according to the present embodiment in the audio mode.

When the audio mode is set at step S103 and the process advances to step S107, at step S107, the fade control portion 26 uses the fade signal Cont to set each of the faders of the output signal generation portion 100 as shown in Table 1 below, for example.

TABLE 1

|  | Cross fader Target gain | Monitor fader Target gain |
| --- | --- | --- |
| LL(L) | 0 dB | −∞ dB |
| LR | −∞ dB | −∞ dB |
| RL | −∞ dB | −∞ dB |
| RR(R) | 0 dB | −∞ dB |

By controlling each of the faders to the type of values shown in Table 1, the faders of the monitor fader 120 shut out all of the external signals ML and MR from the output signals OL and OR, and thus, the output signal generation portion 100 has a circuit structure as shown, in simplified form, in FIG. 7. In other words, the cross fader 130 mixes the L channel audio signal SL with the L channel output signal OL, and mixes the R channel audio signal SR with the R channel output signal OR. Therefore, by the output signal generation portion 100, the output signal OL is mixed with the L channel audio signal SL and the L channel NC signal NL, resulting in the L channel audio signal with reduced noise. On the other hand, the output signal OR is mixed with the R channel audio signal SR and the R channel NC signal NR, resulting in the R channel audio signal with reduced noise. In this way, when in the audio mode, the headphones 1 can output the stereo audio signals SL and SR as the stereo output signals OL and OR corresponding to each of the channels.

2-4-2. Operation in External Mode

Figure 8:
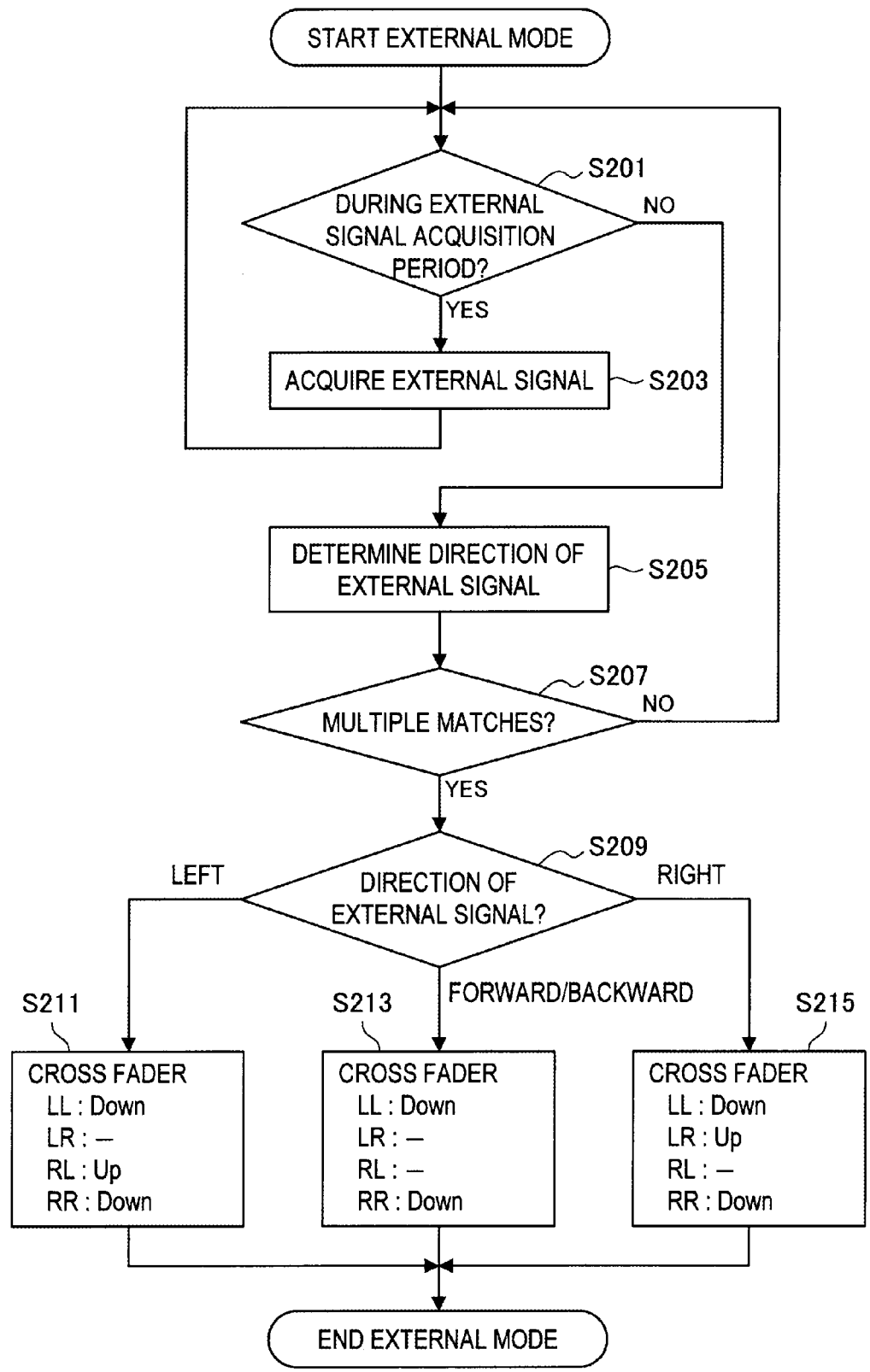
FIG. 8 is an explanatory diagram illustrating an operation in an external mode of the headphones according to the first embodiment.
Figure 9:
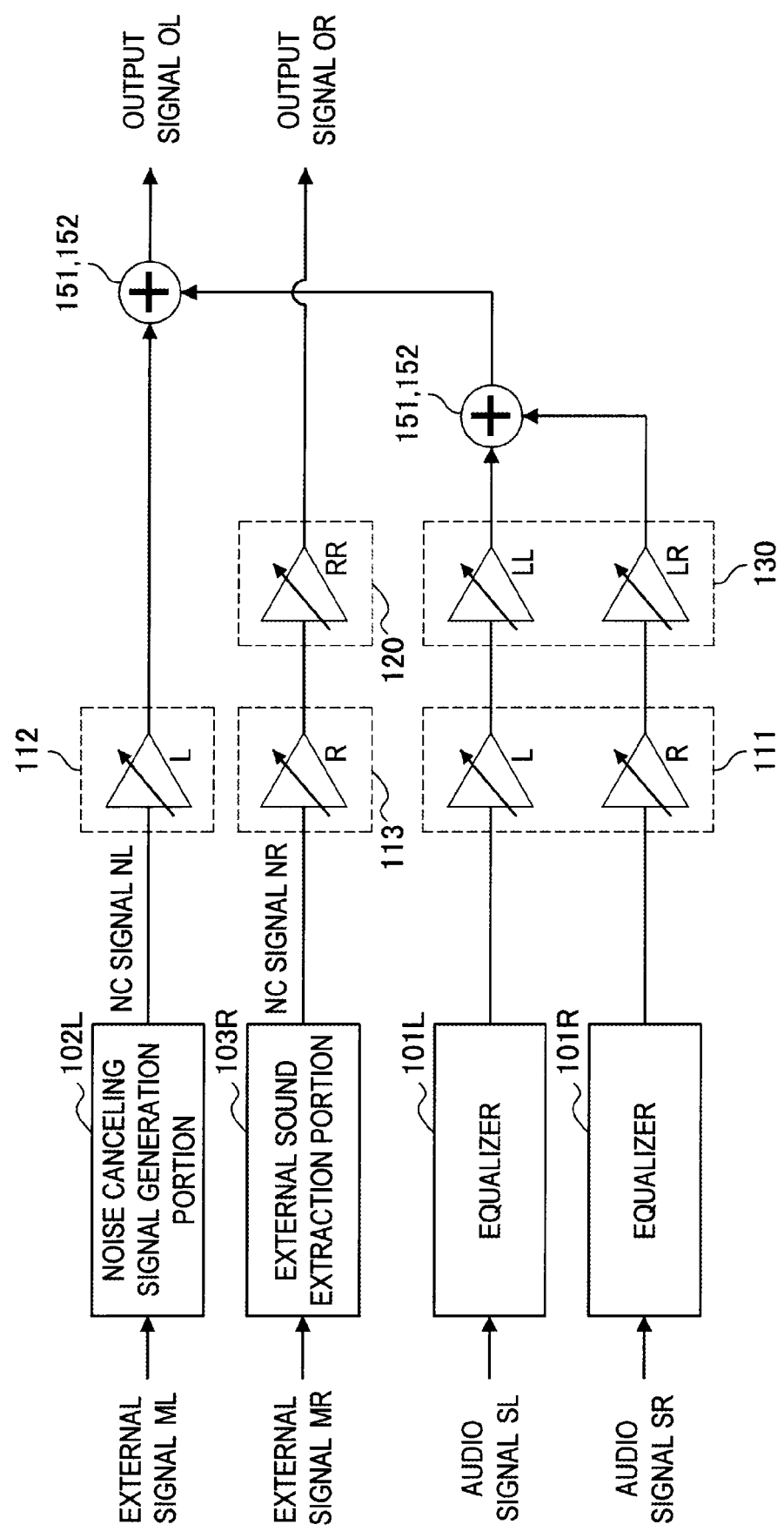
FIG. 9 is an explanatory diagram illustrating an operation in an external mode of the headphones according to the first embodiment.

FIG. 8 and FIG. 9 are explanatory diagrams illustrating operation of the headphones 1 according to the present embodiment in the external mode.

At step S103, when the external mode is set by the mode setting portion 25, and the process advances to step S109, the processing performed at step S107 is as shown in FIG. 8.

In the external mode, first, processing at step S201 is performed, as shown in FIG. 8. At step S201, the direction specification portion 21 confirms whether or not the process is currently in an external signal acquisition period that is set in advance. The external signal acquisition period is, for example, set to be approximately 0.1 to a few seconds. When the external mode is set, and when step S201 is repeatedly performed after step S207 or when step S109 is repeated in the loop shown in FIG. 6, a count is started. Then, if processing is in the external signal acquisition period, the process advances to step S203. If processing is not in the external signal acquisition period, the process advances to step S205.

At step S203, the direction specification portion 21 performs sampling of each of the external signals ML and MR. The process then returns to step S201.

On the other hand, at step S205, the direction specification portion 21 compares the external signals ML and MR sampled at step S203, and specifies the signal with the larger volume level as being the originator direction. More specifically, for example, the direction specification portion 21 squares and sums each of the sampled external signals ML and MR and compares those values on the left and the right. Then, the direction specification portion 21 specifies the signal with the larger value as being the originator direction. In other words, when the L channel external signal ML is larger, when an absolute value of a difference between the two values exceeds a predetermined threshold, the left direction is specified as being the originator direction. On the other hand, when the R channel external signal MR is larger, and when the absolute value of the difference between the two values exceeds the predetermined threshold, the right direction is specified as being the originator direction. Furthermore, when the magnitudes of the external signals ML and MR of both the channels are substantially the same or when a difference between the two magnitudes is equal to or less than a predetermined threshold, the forward/backward direction is specified as being the originator direction. It goes without saying that, at step S205, it is not necessary to compare the squared and summed values of the respective external signals ML and MR, but changes can be made, such as comparing summed values of absolute values and so on. It should also be noted that the external signals ML and MR compared by the direction specification portion 21 are the external signals ML and MR from which the audio frequency bandwidth targeted by the external sound extraction portions 103L and 103R has been removed. After processing at step S205, the process advances to step S207.

At step S207, the direction specification portion 21 determines whether or not there are a predetermined number of multiple matches in the originator direction specification results. When there are not multiple matches, the processing from step S201 onwards is repeated, and when there are multiple matches, the direction specification portion 21 outputs, to the fade control portion 26, the direction signal Dir that indicates the originator direction. The process then advances to step S209.

Note here that, in later-described processing, the output signals OL and OR are output in accordance with the originator direction indicated by the direction signal Dir. In this way, by not advancing to the next step based on a single originator direction specification result, but by achieving the predetermined number of multiple matches in the specification results, it is possible to avoid the output signals OL and OR changing frequently for each external signal acquisition period at step S201. However, when the mode is switched to the external mode etc. by the mode switchover signal CM based on operation by the user U, when the external mode starts up, it is also possible to advance directly to step S209 without performing processing at step S207. By not performing the plurality of determinations when the external mode starts up in this way, it is possible to rapidly switch modes in accordance with operation by the user U.

When there are multiple matches in the specification results at step S207 and the process advances to step S209, at step S209, the fade control portion 26 determines whether the originator direction is to the left, in the forward/backward direction or to the right. When the originator direction is to the left, the process advances to step S211; when the originator direction is in the forward/backward direction, the process advances to step S213; and when the originator direction is to the right, the process advances to step S215.

At steps S211, S213 and S215 (examples of the output signal generating step), each of the faders of the output signal generation portion 100 are adjusted by the fade signal Cont emitted by the fade control portion 26, and the output signals OL and OR are generated in accordance with the originator direction. However, the fade control portion 26 does not suddenly change each of the faders to the set value in accordance with the originator direction, but gradually changes each of the faders to the set value in accordance with the originator direction.

At step S211, in other words, when the originator direction is to the left, the fade control portion 26 sets, using the fade signal Cont, each of the faders of the output signal generation portion 100 as shown in Table 2 below, for example. Note that, in Table 2, the fade direction indicates the direction of switching to the external mode from the state in which the audio mode is set, as noted in Table 1. An explanation of the fade direction is the similar to that for the other tables and for FIG. 8 and FIG. 10, and in step S211 to step S215 in FIG. 8 and step S303 to S307 in FIG. 10, the fade direction of each of the faders of the cross fader 130 is given as an example.

TABLE 2

|  | Cross fader | | Monitor fader | |
| --- | --- | --- | --- | --- |
|  | Fade direction | Target gain | Fade direction | Target gain |
| LL(L) | Down | −∞ dB | Up | −6 dB |
| LR |  | −∞ dB | Up | −6 dB |
| RL | Up | −6 dB |  | −∞ dB |
| RR(R) | Down | −6 dB |  | −∞ dB |

On the other hand, at step S213, in other words, when the originator direction is in the forward/backward direction, the fade control portion 26 sets, using the fade signal Cont, each of the faders of the output signal generation portion 100 as shown in Table 3 below, for example.

TABLE 3

|  | Cross fader | | Monitor fader | |
| --- | --- | --- | --- | --- |
|  | Fade direction | Target gain | Fade direction | Target gain |
| LL(L) | Down | −6 dB | Up | −6 dB |
| LR |  | −∞ dB |  | −∞ dB |
| RL |  | −∞ dB |  | −∞ dB |
| RR(R) | Down | −6 dB | UP | −6 dB |

At step S215, namely, when the originator direction is to the right, the fade control portion 26 sets, using the fade signal Cont, each of the faders of the output signal generation portion 100 as shown in Table 4 below, for example.

TABLE 4

|  | Cross fader | | Monitor fader | |
| --- | --- | --- | --- | --- |
|  | Fade direction | Target gain | Fade direction | Target gain |
| LL(L) | Down | −6 dB |  | −∞ dB |
| LR | Up | −6 dB |  | −∞ dB |
| RL |  | −∞ dB | Up | −6 dB |
| RR(R) | Down | −∞ dB | Up | −6 dB |

A case in which the audio mode has been switched to the external mode and processing has been performed at step S215, namely when the originator direction is to the right, will be explained in more detail.

At step S215, by controlling each of the faders to the type of values shown in Table 4, the output signal generation portion 100 has a circuit structure as shown, in simplified form, in FIG. 9.

In other words, the cross fader 130 is adjusted such that both the L and R channel audio signals SL and SR are substantially equally downmixed and are included in the L channel output signal OL (that is the opposite direction to the originator direction). On the other hand, the cross fader 130 is blocked such that the audio signals SL and SR in the R channel output signal OR (that is the same direction as the originator direction) are not included in the R channel output signal OR. Note that, when downmixing the audio signals SL and SR, so that the volume level does not become too large, it is preferable for the faders LL and LR of the cross fader 130 to be set to have a lower value than 0 dB (−6 dB, for example). The examples in Table 2 to Table 4 have a value of −6 dB that is lower than 0 dB, but the invention is not limited to this particular value.

In contrast to the above, the monitor fader 120 is adjusted such that both the L and R channel external signals ML and MR are substantially equally downmixed and are included in the R channel output signal OR (that is the same direction as the originator direction). On the other hand, the monitor fader 120 is blocked such that the external signals ML and MR in the L channel output signal OL (that is the opposite direction to the originator direction) are not included in the L channel output signal OL. Note that, when downmixing the external signals ML and MR, so that the volume level does not become too large, it is preferable for the faders RL and RR of the monitor fader 120 to be set to have a lower value than 0 dB (−6 dB, for example).

In this way, by the output signal generation portion 100, the L channel output signal OL (that is the opposite direction to the originator direction) is generated as an audio signal that is downmixed with the L channel audio signal SL and the R channel audio signal SR and is further mixed with the L channel NC signal NL. On the other hand, the R channel output signal OR (that is the same direction as the originator direction) is generated as an audio signal that is downmixed with the L channel external signal ML and the R channel external signal MR and is further mixed with the R channel NC signal NR. As a result, when in the external mode, the headphones 1 can output the monaural audio signal S as the L channel output signal OL that is the opposite direction to the originator direction, and can output the monaural external signal M as the R channel output signal OR that is the same direction as the originator direction.

As a consequence, the user U can listen not only to the external sound MS represented by the external signal M, but can also listen to the audio signal S, as the audio signal S is not lost in one of either the left and right sides. It is thus possible to also listen to the external sound MS represented by the external signal M, while still enjoying the audio content represented by the audio signal S. It should be noted here that, at this time, the user U can be aware of the direction of the originator MM by the channel through which the external sound MS is emitted.

The example described above is an example in which the originator direction is in either the left or the right direction. However, when the originator direction is in the left direction, the fade control portion 26 outputs the fade signal Cont to adjust each of the faders as shown in Table 2. As a result, in contrast to when the above-described originator direction is in the right direction, it is possible to output the output signals OL and OR for which the L and R channels are reversed. In this case, apart from the fact that each of the signals flowing through the L and R channels is reversed, in principle, the same operations are performed as when the above-described originator direction is in the right direction, and a further explanation is therefore omitted here.

Meanwhile, when the originator direction is in the forward/backward direction, the fade control portion 26 outputs the fade signal Cont to adjust each of the faders as shown in Table 3. As a result, the cross fader 130 includes the L channel audio signal SL in the L channel output signal OL and also includes the R channel audio signal SR in the R channel output signal OR. Then, the monitor fader 120 includes the L channel external signal ML in the L channel output signal OL and includes the R channel external signal MR in the R channel output signal OR.

Thus, the L channel output signal OL is generated as an audio signal that is mixed with the L channel audio signal SL and the L channel external signal ML, and is further mixed with the L channel NC signal NL. On the other hand, the R channel output signal OR is generated as an audio signal that is mixed with the R channel audio signal SR and the R channel external signal MR, and is further mixed with the R channel NC signal NR. Therefore, when in the audio mode, the headphones 1 can mix the stereo audio signals SL and SR and the stereo external signals ML and MR for each of the channels and can output the stereo output signals OL and OR.

As a consequence, the user U can listen not only to the external sound MS represented by the external signal M, but can also listen to the audio signal S, as the audio signal S is not lost in one of either the left and right sides. It is thus possible to also listen to the external sound MS represented by the external signal M, while still enjoying the audio content represented by the audio signal S. It should be noted here that, at this time, the user U can be aware that the direction of the originator MM is in the forward/backward direction by the fact that the external sound MS is being emitted through both the channels.

In the above description, a case is explained in which the audio mode is switched to the external mode, including an explanation of the fade direction. Note that, when switching from the information mode to the external mode, or when the originator direction changes while in the external mode, apart from differences in some of the fade directions, other operations performed are similar.

2-4-3. Operation when Ending External Mode

Figure 10:
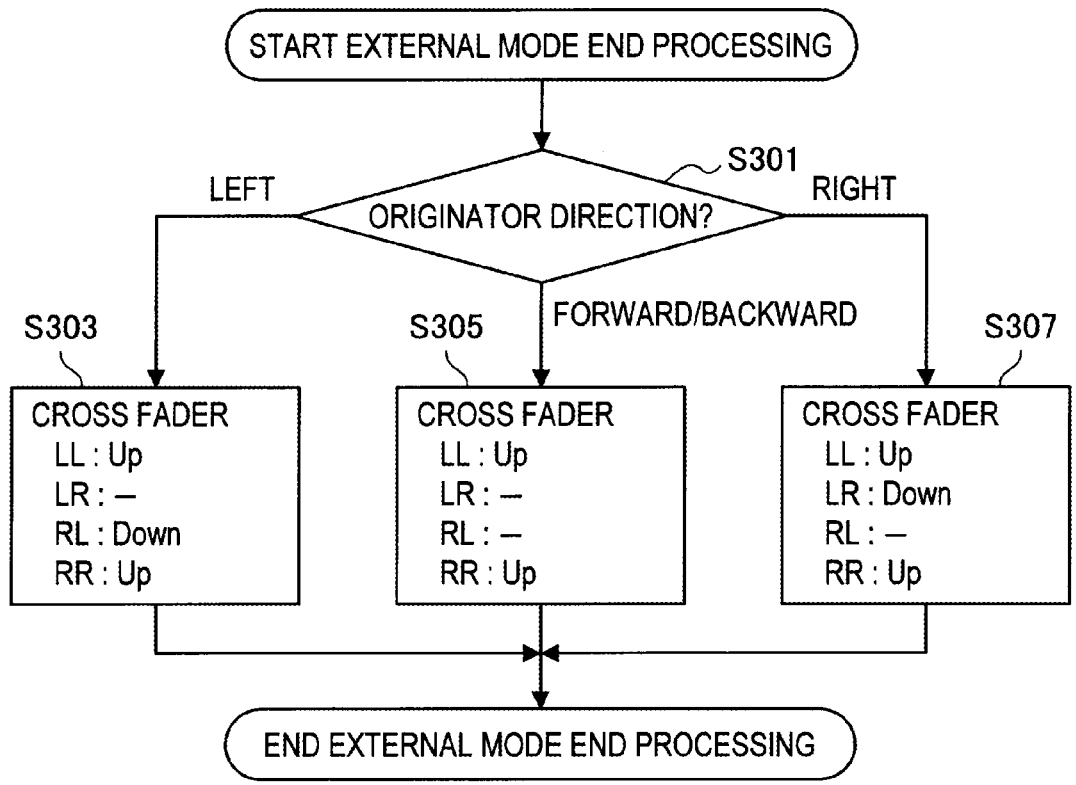
FIG. 10 is an explanatory diagram illustrating an operation when switching between operation modes of the headphones according to the first embodiment.

An operation will now be explained, with reference to FIG. 6 and FIG. 10, in which the operation mode is switched from the external mode explained above to the audio mode, namely the operation when the external mode is ended and a normal mode is reverted to. FIG. 10 is an explanatory diagram illustrating an operation of the headphones 1 according to the present embodiment when switching operation mode.

At step S103 in FIG. 6, when the operation mode is switched from the external mode to the audio mode, the process advances from step S105 to step S107, and at step S107, the process shown in FIG. 10 is performed.

First, when the external mode is ended, the process at step S301 is performed. At step S301, the fade control portion 26 confirms the originator direction set in the external mode. Then, when the originator direction is in the left direction, the process advances to step S303. When the originator direction is in the forward/backward direction, the process advances to step S305, and when the originator direction is in the right direction, the process advances to step S307.

At step S303, step S305 and step S307 (examples of the output signal generating step), each of the faders of the output signal generation portion 100 are adjusted to the values shown in Table 1 by the fade signal Cont emitted by the fade control portion 26, and the output signals OL and OR are generated. At this time, as exemplified by the fade direction etc. of each of the faders of the cross fader 130 at step S303 to step S307, it is preferable for the fade control portion 26 to not suddenly change each of the faders to the set values of the audio mode, but to gradually change each of the faders to the set values of the audio mode. When the external mode end operation is ended, the processing from step S101 onwards is repeated via step S113, as shown in FIG. 6.

2-4-4. Operation in Information Mode

In the information mode, which is the remaining operation mode that is set according to the present embodiment, operation is, in principle, performed in a similar manner to operation of the external mode. However, in this case, the fade control portion 26 sets the external signal adjustment fader 113 to −∞ dB and shuts it off, while it provides, in the line in which the external signals ML and MR are flowing, the information signals IL and IR via the information signal adjustment fader 114. Thus, in contrast to the operation in the above-described external mode, the information signals IL and IR are provided in place of the external signals ML and MR. As a result, in contrast to the operation in the above-described external mode, the information signals IL and IR are read in place of the external signals ML and MR and operation in the information mode can be realized by making only a few other changes. A detailed explanation is therefore omitted here.

2-5. Example of Effects

Hereinabove, the headphones 1 according to the first embodiment of the present invention are explained.

According to the headphones 1, depending on the operation mode, the audio content represented by the audio signal S can be provided to the user U while, at the same time, the external sound MS represented by the external signal M can also be provided. At this time, the stereo audio signal S is provided to the user U in stereo as it is, or alternatively, it is converted to a monaural signal and provided to the user U. The user U is thus able to enjoy audio of both channels of the audio signal S, while avoiding a situation which causes discomfort to the user U, such as the user U not being able to listen to one or other of the channels of the stereo audio signal S. Note that, depending on the direction of the channel providing the external signal M, the user U can be aware of the direction in which the originator MM is positioned.

Note also that, according to the first embodiment of the present invention, when in the external mode, by changing the set value of each of the faders, it is possible to output, from the channel in the direction opposite to the originator direction, one of the channels of the stereo audio signal S. However, in this case, this is a state similar to when the user U removes one side of the headphones 1. As a result, when there is a large difference between the two channels of the stereo audio signal S, there is a risk that the user U may be inconvenienced by not hearing the audio signal S on the other channel. Therefore, as described in the present embodiment, when outputting the audio signal S on one of the channels only, it is preferable to downmix the stereo audio signal S to the monaural audio signal S and output the monaural signal as the audio signal S.

In addition, as there is a noise canceling function in the present embodiment, it is possible to improve the sound quality of the output signal OS by the noise reduced output signals OL and OR. This type of noise canceling function has become widespread in recent years, but, as the noise canceling function reduces ambient sound as noise, in comparison to a case in which this function is not present, it is difficult for the user U to listen to ambient sound. However, as explained above, according to the headphones 1 of the present embodiment, it is possible to include ambient sound in the output audio OS as the external sound MS. As a consequence, when the headphones 1 are used in conjunction with this type of noise canceling function, effects of eliminating discomfort of and inconvenience to the user U are greatly increased. It should be noted, however, that it is of course not a necessity to use the noise canceling function in conjunction with the headphones 1.

3. Second Embodiment

According to the above-described headphones 1 according to the first embodiment, by changing the set value of each of the faders in accordance with each of the operation modes, it is possible to freely change the combination of the audio signals SL and SR and the external signals ML and MR of each of the operation modes.

For example, according to the above-described first embodiment, when the originator direction is to the right or to the left in the external mode, the external signal M that is downmixed to a monaural signal is output from the channel of the originator direction, and the audio signal S that is downmixed to a monaural signal is output from the other channel.

In contrast, for example, when the originator direction is to the right or to the left in the external mode, while outputting the stereo audio signal S from the corresponding channel, it is also possible to mix the stereo external signal M with the output signal O and output the mixed signal from both the channels. In this case, it is also possible to make the user U aware of the direction of the originator MM by setting an uneven attenuation factor, by lowering the attenuation factor on the fader LL and the fader RR of the monitor fader 120 for the channel on the side corresponding to the originator direction or so on. However, it is of course also possible to set the attenuation factor of the fader LL and the fader RR to be uniform.

Figure 11:
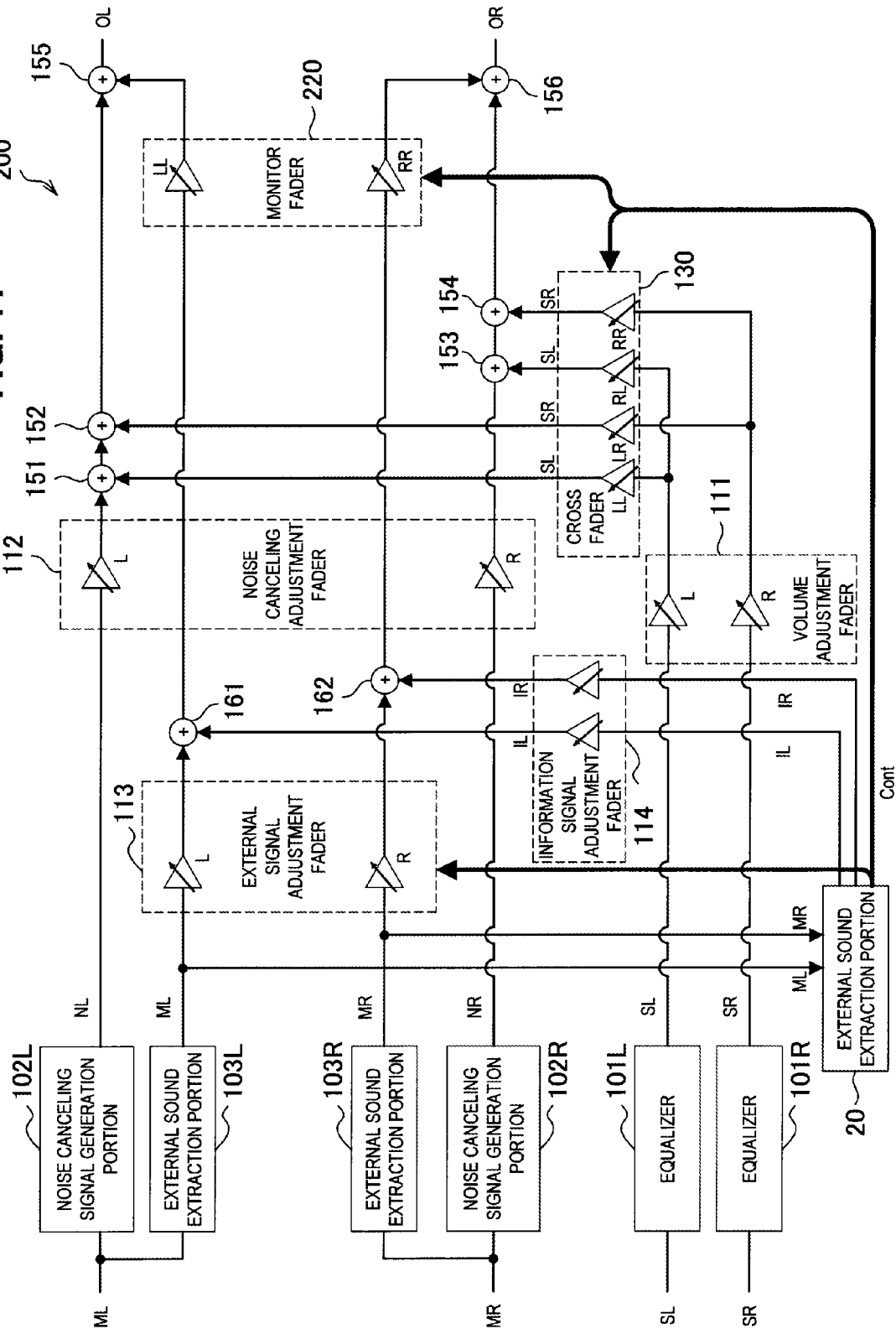
FIG. 11 is an explanatory diagram illustrating the structure of the headphones according to a second embodiment of the present invention.

In addition, in this case, in contrast to the above-described first embodiment, the stereo external signals ML and MR can be provided to the user U as a stereo signal without being downmixed. At this time, the other faders LR and RL of the monitor fader 120 are constantly set to $-\infty$ dB. As a result, a type of output signal generation portion 200, as shown in FIG. 11 as an exemplification of the second embodiment, can be used in place of the output signal generation portion 100. The output signal generation portion 200 provided in the headphones 1 according to the second embodiment has a monitor fader 220 in place of the monitor fader 120. The monitor fader 220 according to the second embodiment has the structure of the monitor fader 120 according to the first embodiment from which the faders LR and RL and the adding circuits 157 and 158 have been removed. Thus, in addition to achieving the effects of the above-described first embodiment in a similar manner, the second embodiment further achieves simplification of the device structure and manufacturing costs can therefore be reduced.

4. Third Embodiment

In addition, in contrast to the second embodiment, when information of the external signals ML and MR is provided as a monaural and not as a stereo signal, even when the originator direction is in the forward/backward direction, the external signals ML and MR can be downmixed and included in both the output signals OL and OR. In this case, with the headphones 1 according to the first embodiment, when in the external mode and when the originator direction is in the forward/backward direction, the faders LR and RL of the monitor fader 120 are changed from $-\infty$ dB to a predetermined value that is equal to the faders LL and RR. Note that in the first embodiment, the predetermined value is $-6$ dB, but it is preferable to set a larger attenuation value such that the volume level does not become too large due to the downmixing of both the left and the right external signals ML and MR.

Figure 12:
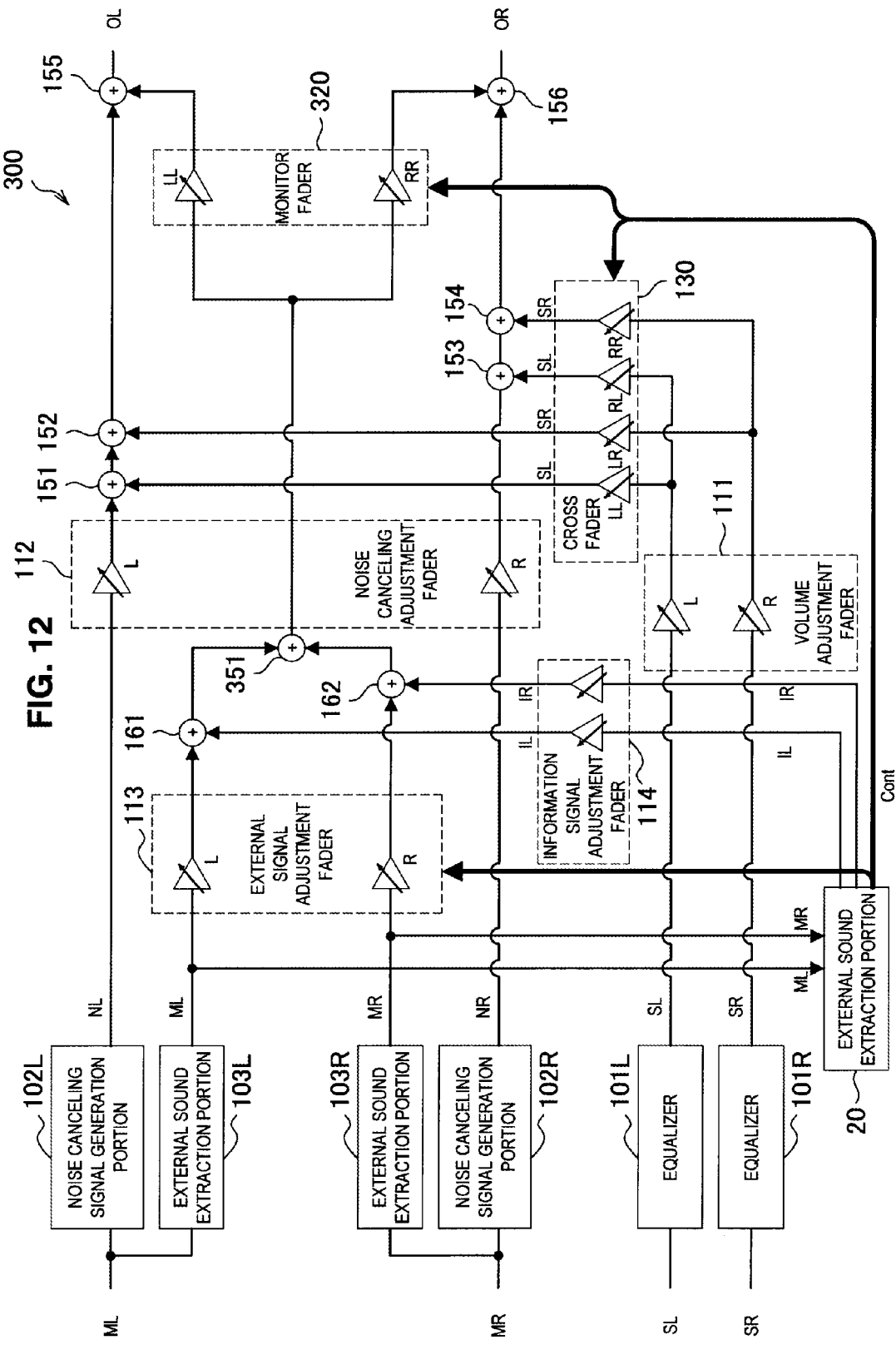
FIG. 12 is an explanatory diagram illustrating the structure of the headphones according to a third embodiment of the present invention.

In the above case, a type of output signal generation portion 300, as shown in FIG. 12 as an exemplification of the third embodiment, can also be used in place of the output signal generation portion 100. The output signal generation portion 300 provided in the headphones 1 according to the third embodiment has a monitor fader 320 in place of the monitor fader 120. The monitor fader 320 according to the third embodiment has the structure of the monitor fader 120 according to the first embodiment from which the faders LR and RL and the adding circuits 157 and 158 have been removed. In addition, the output signal generation portion 300 according to the third embodiment has an adding circuit 351 that downmixes the L and R channel external signals ML and MR (or the information signals IL and IR) to a monaural signal. As a result, it is possible to reduce one line of the signal wire in some sections between the adding circuit 351 and the monitor fader 320. Thus, in addition to achieving the effects of the above-described first embodiment in a similar manner, the third embodiment further achieves simplification of the device structure and manufacturing costs can therefore be reduced.

Above, the preferred embodiments of the present invention are described with reference to the appended drawings, but it is needless to say that the present invention is not limited to these examples. It should be understood by those skilled in the art that various modifications, combinations, sub-combinations and alterations may occur depending on design requirements and other factors insofar as they are within the scope of the appended claims or the equivalents thereof.

For example, in the above-described embodiments, cases are described in which the external signal M is a stereo signal. However, even when the external signal M is a monaural signal, the above embodiments can achieve similar effects. As it becomes difficult in this case for the direction specification portion 21 to specify the originator direction, for example, similarly to the channel of the direction in which the external signal M is acquired, the channel of the output signal O that outputs the external signal M may be set in advance. Alternatively, as in the case when the originator direction is in the forward/backward direction in the above-described first embodiment, the analog external signal M can also be included in both channels of the output signals OL and OR. Further, it goes without saying that, even in cases other than this type of analog external signal M, by setting in advance whether both or one of the channels will include the external signal M, it is possible to provide the external signal M that does not correspond to the originator direction. Note that details of the changes explained here are similar to those for the stereo information signals IL and IR in the above-described embodiments.

In addition, in the above-described embodiments, cases are described in which the audio signal S is provided. However, even when the audio signal S is not provided (namely, when there is a state of no audio), the headphones 1 according to each of the above-described embodiments can perform similar operations.

Furthermore, in the above-described embodiments, cases are described in which the audio signal S, the external signal M and the information signals IL and IR are respectively provided as digital signals. However, some or all of this information may be provided as analog signals. In this case, the headphones 1 can be structured by omitting the digital/analog converter circuit 12 etc. and structuring each of the faders etc. as analog circuits.

In the above-described embodiments, as shown in FIG. 5, FIG. 11 and FIG. 12 etc., with respect to the output signal generation portions 100, 200 and 300, cases are described in which faders etc. are used as a structure to adjust a mixing state of each of the signals. However, in FIG. 5, FIG. 11 and FIG. 12, by using switches and amplifier circuits etc. that can perform similar operations, the output signal generation portions 100, 200 and 300 can be structured without using faders.

The series of processes of each of the above-described embodiments may be performed by dedicated hardware, or may be performed by software. When the series of processes are performed by software, the above-described series of processes can be realized by causing a program to be executed on a general-purpose or dedicated computer 900 shown in FIG. 13.

Figure 13:
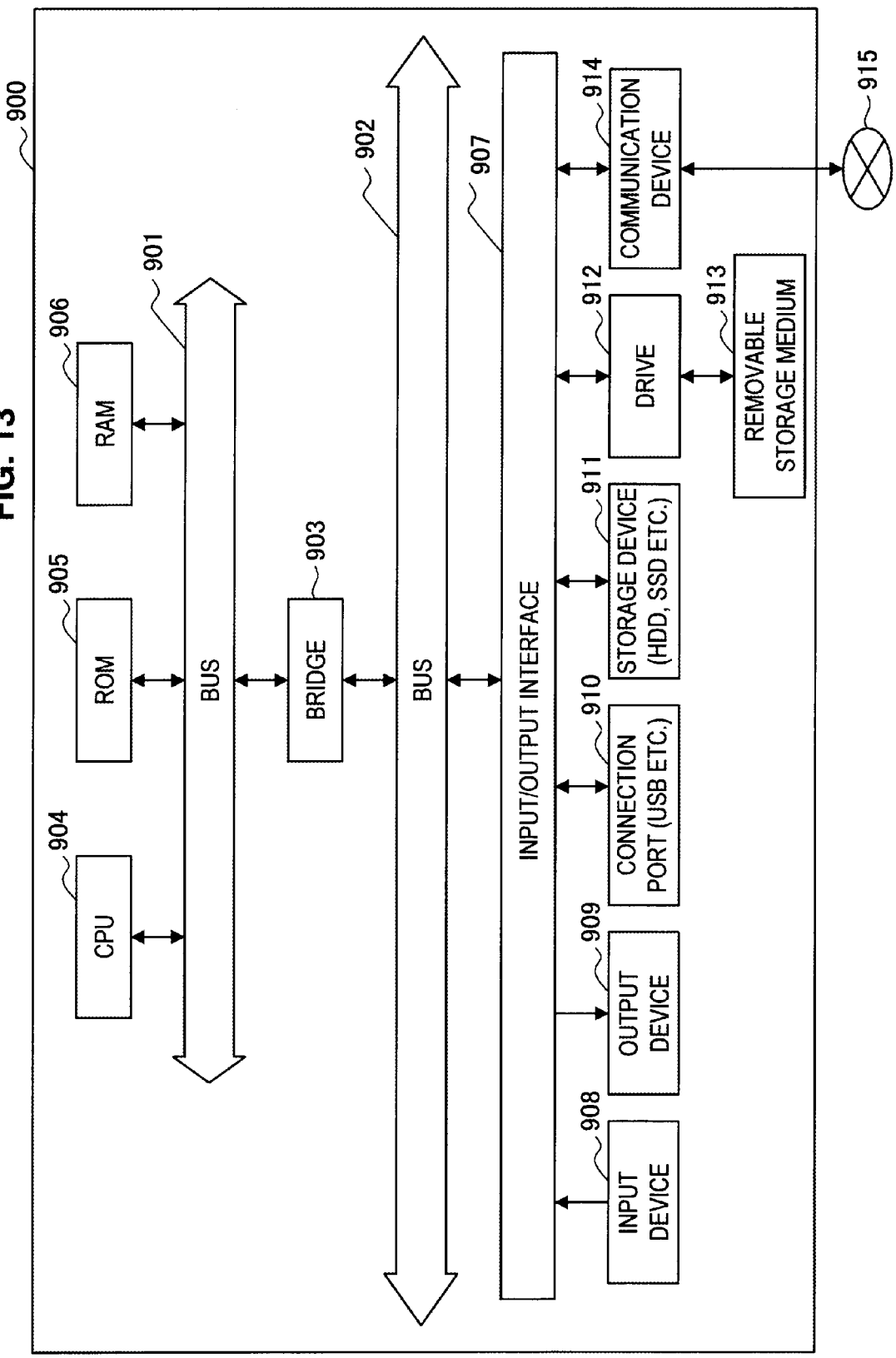
FIG. 13 is an explanatory diagram illustrating an example of the structure of a computer that realizes a series of processes by executing a program.

FIG. 13 is an explanatory diagram illustrating an example of the structure of the computer 900 that realizes the series of processes by executing a program. Execution by the computer 900 of the program that performs the series of processes will be explained as follows.

As shown in FIG. 13, the computer has, for example, a bus 901 and a bus 902, a bridge 903, a central processing unit (CPU) 904, a storage device, an input/output interface 907, an input device 908, an output device 909, a connection port 910, a drive 912 and a communication device 914. Each of these structural elements are connected via the bus 901 and the bus 902 that are connected by the bridge 903 or via the input/output interface 907 etc. such that they can perform mutual information transfer.

The program can be stored in, for example, a storage device 911 such as a hard disk drive (HDD) or a solid state drive (SSD), or in a read only memory (ROM) 905, a random access memory (RAM) 906 or the like, which are an example of the storage device.

Further, the program can be temporarily or permanently stored in a removable storage medium 913. The removable storage medium 913 can be, for example, a magnetic disk such as a flexible disk etc.; an optical disk such as a compact disc (CD), a magneto-optical (MO) disk, or a digital versatile disc (DVD); or a semiconductor memory etc. This type of removable storage medium 913 can be provided as so-called package software. The program that is stored in this type of removable storage medium 913 may be read by the drive 912 and stored in the above-described storage device via the input/output interface 907, the bus 901 and the bus 902 etc.

In addition, the program can be stored in, for example, a download site, another computer or another storage device etc. (not shown in the figures). In this case, the program is transferred via a network 915, such as a local area network (LAN) or the Internet etc. and the communication device 914 receives the program. Additionally, the program may be transferred from another storage device or communication device that is connected to the connection port 910 that is a universal serial bus (USB) or the like. The program that is received by the communication device 914 or the communication port 910 may then be stored in the above-described storage device via the input/output interface 907, the bus 901 and the bus 902 etc.

The above-described series of processes are realized by the CPU 904 performing each of the processes in accordance with the program stored in the above-described storage device. At this time, the CPU 904 may, for example, directly read and execute the program stored in the above-described storage device, or may execute the program after temporarily loading it in the RAM 905. In addition, when the program is received via the communication device 914 and the drive 912, for example, the CPU 904 may directly execute the received program without storing it in the storage device.

Furthermore, as necessary, the CPU 904 may perform each of the processes based on a signal or information input from an input device 908 such as a mouse, a keyboard or a microphone, for example (not shown in the figures) or from another input device that is connected to the connection port 910.

The CPU 904 may then output, from the output device 909, results of performing the above-described series of processes to, for example, a display device such as a monitor etc., or to an audio output device such as a speaker or headphones or so on. Further, the CPU 904 may, as necessary, transmit the process results from the communication device 914 or the connection port 910, and may store the results in the above-described storage device or removable storage medium 913.

In the present specification, the steps noted in the flow charts, including of course the processes performed chronologically, do not necessarily need to be performed chronologically, and also include processes performed in parallel or individually. It goes without saying that even for the steps that are preformed chronologically, the order can be changed as necessary and depending on circumstances.

The present application contains subject matter related to that disclosed in Japanese Priority Patent Application JP 2009-026552 filed in the Japan Patent Office on Feb. 6, 2009, the entire content of which is hereby incorporated by reference.

What is claimed is:

1. A signal processing device comprising:
   an audio signal acquisition portion to acquire a stereo audio signal representing stereo audio content, the audio signal comprising a first audio signal and a second audio signal;
   an external signal acquisition portion to acquire a stereo external signal representing external sound obtained by collecting ambient sound, the stereo external signal comprising a first external signal and a second external signal;
   an output signal generation portion to generate, from the stereo audio signal acquired by the audio signal acquisition portion and the stereo external signal acquired by the external signal acquisition portion, a stereo output signal representing stereo audio provided to a user, the stereo output signal comprising a first output signal provided to the user from a first direction and a second output signal provided to the user from a second direction;
   a mode setting portion to set, as an operation mode of the output signal generation portion, at least an external mode;
   a direction specification portion to specify, when the external mode is set, a direction of an emission source of the external sound with respect to the user, based at least in part on the stereo external signal acquired by the external signal acquisition portion; and
   a fade control portion to control an operation to generate the stereo output signal by the output signal generation portion in accordance with the operation mode set by the mode setting portion and the direction of the emission source of the external sound specified by the direction specification portion, wherein:
   when the external mode is set and the direction of the emission source of the external sound is specified to correspond with the first direction, the fade control portion causes the output signal generation portion to generate the first output from at least the stereo external signal, and also to generate the second output signal from at least the stereo audio signal, and
   wherein
   when the external mode is set, the fade control portion causes the output signal generation portion to generate the first output signal from the stereo external signal only, and to generate the second output signal by converting the stereo audio signal to a monaural audio signal.

2. The signal processing device according to claim 1, wherein
   the mode setting portion also sets, as the operation mode in place of the external mode, at least an audio mode, and
   when the audio mode is set, the fade control portion causes the output signal generation portion to generate the stereo output signal from the stereo audio signal.

3. The signal processing device according to claim 2, further comprising:
   a noise canceling signal generation portion to generate a noise canceling signal that reduces the external sound represented by the stereo external signal, based at least in part on the stereo external signal acquired by the external signal acquisition portion, wherein
   the output signal generation portion superimposes the noise canceling signal on the stereo output signal that is generated from the stereo audio signal to reduce the external sound.

4. The signal processing device according to claim 1, wherein:
   when the direction specification portion specifies that the direction of the emission source is in a flat plane including a forward and a backward direction with respect to the user, the fade control portion causes the output signal generation portion to generate the first output signal by superimposing the first audio signal and the first external signal, and to generate the second output signal by superimposing the second audio signal and the second external signal.

5. The signal processing device according to claim 2, wherein
   the mode setting portion switches between the audio mode and the external mode in accordance with operation by the user.

6. The signal processing device according to claim 1, further comprising:
   an information signal acquisition portion to acquire, from an external information transmission device, an information signal, different from the stereo audio signal and the stereo external signal, that represents audio information to be provided to the user, wherein
   when the information signal acquisition portion has acquired the information signal, the mode setting portion sets, as the operation mode, an information mode, and
   when the information mode is set, the fade control portion causes the output signal generation portion to generate the first output signal from at least the information signal, and also to generate the second output signal from at least the stereo audio signal.

7. The signal processing device according to claim 2, further comprising:
   an audio recognition portion to acquire the stereo external signal in the audio mode, and to determine whether a predetermined audio signal is included in the stereo external signal, wherein
   when it is determined that the predetermined audio signal is included in the stereo external signal, the mode setting portion switches to the external mode as the operation mode.

8. The signal processing device according to claim 1, wherein the output signal generation portion comprises:
   an audio signal adjustment portion that comprises a plurality of faders that adjust respective volumes of the of the first audio signal and the second audio signal, and
   an external signal adjustment portion that comprises a plurality of faders that adjust respective volumes of the of the first external signal and the second external signal.

9. A signal processing method, comprising acts of:
   acquiring a stereo audio signal representing stereo audio content, the audio signal comprising a first audio signal and a second audio signal;
   acquiring a stereo external signal representing external sound obtained by collecting ambient sound, the stereo external signal comprising a first external signal and a second external signal;
   setting at least an external mode as an operation mode;
   specifying, when the external mode is set, a direction of an emission source of the external sound with respect to a user, based at least in part on the stereo external signal; and
   in accordance with the operation mode and the direction of the emission source of the external sound, generating, from the stereo audio signal and from the stereo external signal, an output signal representing stereo audio provided to the user, the stereo output signal comprising a first output signal provided to the user from a first direction and a second output signal provided to the user from a second direction, wherein:

when the external mode is set and the direction of the emission source of the external sound is specified to correspond with the first direction, the first output signal is generated from at least the stereo external signal, and also, the second output signal is generated from at least the stereo audio signal, and when the external mode is set, generating the first output signal from the stereo external signal only, and generating the second output signal by converting the stereo audio signal to a monaural audio signal.

10. The signal processing method according to claim 9, further comprising:

generating a noise canceling signal that reduces the external sound represented by the stereo external signal, based at least in part on the stereo external signal acquired by the external signal acquisition portion, wherein generating the output signal comprises superimposing the noise canceling signal on the stereo output signal that is generated from the stereo audio signal to reduce the external sound.

11. The signal processing method according to claim 9, wherein:

when the specified direction of the emission source is in a flat plane including a forward and a backward direction with respect to the user, generating the first output signal by superimposing the first audio signal and the first external signal, and generating the second output signal by superimposing the second audio signal and the second external signal.

12. The signal processing method according to claim 9, further comprising:

acquiring, from an external information transmission device, an information signal, different from the stereo audio signal and the stereo external signal, that represents audio information to be provided to the user;

when the information signal is acquired, setting, as the operation mode, an information mode; and when the information mode is set, generating the first output signal from at least the information signal, and also to generate the second output signal from at least the stereo audio signal.

13. At least one computer readable medium having instructions encoded thereon which, when executed by a computer, cause the computer to function as:

an audio signal acquisition device to acquire a stereo audio signal representing stereo audio content, the audio signal comprising a first audio signal and a second audio signal;

an external signal acquisition device to acquire an stereo external signal representing external sound obtained by collecting ambient sound, the stereo external signal comprising a first external signal and a second external signal;

an output signal generation device to generate, from the stereo audio signal acquired by the audio signal acquisition portion and the stereo external signal acquired by the external signal acquisition portion, a stereo output signal representing stereo audio provided to a user, the stereo output signal comprising a first output signal provided to the user from a first direction and a second output signal provided to the user from a second direction;

a mode setting device to set, as an operation mode of the output signal generation device, at least an external mode;

a direction specification device to specify, when the external mode is set, a direction of an emission source of the external sound with respect to the user, based at least in part on the stereo external signal acquired by the external signal acquisition device;

a fade control device to control an operation to generate the stereo output signal by the output signal generation device in accordance with the operation mode set by the mode setting device and the direction of the emission source of the external sound specified by the direction specification device, wherein when the external mode is set and the direction of the emission source of the external sound is specified to correspond with the first direction, the fade control device causes the output signal generation device to generate the first output signal from at least the stereo external signal, and also to generate the second output signal from at least the stereo audio signal, and when the external mode is set, the fade control device causes the output signal generation device to generate the first output signal from the stereo external signal only, and to generate the second output signal by converting the stereo audio signal to a monaural audio signal.

14. The at least one computer readable medium according to claim 13, wherein the instructions further cause the computer to function as:

a noise canceling signal generation device to generate a noise canceling signal that reduces the external sound represented by the stereo external signal, based at least in part on the stereo external signal acquired by the external signal acquisition portion, wherein the output signal generation device superimposes the noise canceling signal on the stereo output signal that is generated from the stereo audio signal to reduce the external sound.

15. The at least one computer readable medium according to claim 13, wherein the instructions further command cause the computer to:

when the specified direction of the emission source is in a flat plane including a forward and a backward direction with respect to the user, the fade control device causes the output signal generation device to generate the first output signal by superimposing the first audio signal and the first external signal, and to generate the second output signal by superimposing the second audio signal and the second external signal.

16. The at least one computer readable medium according to claim 13, wherein the instructions further command cause the computer to function as:

an information signal acquisition device to acquire, from an external information transmission device, an information signal, different from the stereo audio signal and the stereo external signal, that represents audio information to be provided to the user; wherein:

when the information signal acquisition device has acquired the information signal, the mode setting device sets, as the operation mode, an information mode; and when the information mode is set, the fade control device causes the output signal generation device to generate the first output signal from at least the information signal, and also to generate the second output signal from at least the stereo audio signal.

* * * * *